(12) United States Patent
Swindlehurst et al.

(10) Patent No.: US 7,214,569 B2
(45) Date of Patent: May 8, 2007

(54) APPARATUS INCORPORATING SMALL-FEATURE-SIZE AND LARGE-FEATURE-SIZE COMPONENTS AND METHOD FOR MAKING SAME

(75) Inventors: Susan Swindlehurst, Morgan Hill, CA (US); Mark A. Hadley, Newark, CA (US); Paul S. Drzaic, Morgan Hill, CA (US); Gordon S. W. Craig, Palo Alto, CA (US); Glenn Gengel, Hollister, CA (US); Scott Hermann, Hollister, CA (US); Aly Tootoochi, San Jose, CA (US); Randolph W. Eisenhardt, Prunedale, CA (US)

(73) Assignee: Alien Technology Corporation, Morgan Hill, CA (US)

(*) Notice: Subject to any disclaimer, the term of this patent is extended or adjusted under 35 U.S.C. 154(b) by 0 days.

(21) Appl. No.: 10/769,572

(22) Filed: Jan. 30, 2004

(65) Prior Publication Data

US 2004/0183182 A1  Sep. 23, 2004

Related U.S. Application Data

(60) Provisional application No. 10/056,192, filed on Jan. 23, 2002.

(51) Int. Cl.
   *H01L 21/00* (2006.01)
   *H01L 21/44* (2006.01)
(52) U.S. Cl. ............... 438/125; 438/597; 438/652; 438/654; 438/665
(58) Field of Classification Search ............... None
   See application file for complete search history.

(56) References Cited

U.S. PATENT DOCUMENTS

| | | | | |
|---|---|---|---|---|
| 3,903,590 | A | * | 9/1975 | Yokogawa ............... 438/107 |
| 4,670,770 | A | * | 6/1987 | Tai ............................ 257/777 |
| 4,783,695 | A | | 11/1988 | Eichelberger et al. |
| 4,818,855 | A | | 4/1989 | Mongeon et al. |
| 4,857,893 | A | | 8/1989 | Carroll |
| 4,918,811 | A | | 4/1990 | Eichelberger et al. |
| 4,937,653 | A | * | 6/1990 | Blonder et al. ............ 257/739 |

(Continued)

FOREIGN PATENT DOCUMENTS

DE  2810005  3/1978

(Continued)

OTHER PUBLICATIONS

PCT Search Report Dated Jul. 1, 2003, 8 pages.

(Continued)

*Primary Examiner*—David E. Graybill
(74) *Attorney, Agent, or Firm*—Blakely, Sokoloff, Taylor & Zafman

(57) ABSTRACT

An apparatus incorporating small-feature size and large-feature-size components. The apparatus comprise a strap including a substrate with an integrated circuit contained therein. The integrated circuit coupling to a first conductor disposed on the substrate. The first conductor is made of a thermosetting or a thermoplastic material including conductive fillers. A large-scale component having a second conductor is electrically coupled to the first conductor to electrically couple the large-scale component to the integrated circuit. The large-scale component includes a second substrate.

27 Claims, 16 Drawing Sheets

U.S. PATENT DOCUMENTS

| | | | |
|---|---|---|---|
| 4,957,776 | A | 9/1990 | Higuchi et al. |
| 4,990,462 | A * | 2/1991 | Sliwa, Jr. .................... 438/107 |
| 5,008,213 | A * | 4/1991 | Kolesar, Jr. ................. 438/107 |
| 5,032,896 | A * | 7/1991 | Little et al. ................. 257/686 |
| 5,048,179 | A * | 9/1991 | Shindo et al. ................. 29/840 |
| 5,083,697 | A | 1/1992 | Difrancesco |
| 5,099,227 | A | 3/1992 | Geiszler et al. |
| 5,138,433 | A | 8/1992 | Hiruta |
| 5,138,436 | A * | 8/1992 | Koepf ........................ 257/728 |
| 5,188,984 | A * | 2/1993 | Nishiguchi ................. 438/107 |
| 5,205,032 | A * | 4/1993 | Kuroda et al. ................. 29/740 |
| 5,212,625 | A | 5/1993 | van Andel et al. |
| 5,221,831 | A | 6/1993 | Geiszler |
| 5,231,751 | A | 8/1993 | Sachdev et al. |
| 5,241,456 | A | 8/1993 | Marcinkiewicz et al. |
| D343,261 | S | 1/1994 | Eberhardt |
| 5,298,685 | A * | 3/1994 | Bindra et al. ................. 174/250 |
| 5,353,498 | A * | 10/1994 | Fillion et al. ................. 29/840 |
| D353,343 | S | 12/1994 | Eberhardt |
| 5,373,627 | A | 12/1994 | Grebe |
| 5,378,880 | A | 1/1995 | Eberhardt |
| 5,382,784 | A | 1/1995 | Eberhardt |
| 5,382,952 | A | 1/1995 | Miller |
| 5,420,757 | A | 5/1995 | Eberhardt et al. |
| 5,422,513 | A * | 6/1995 | Marcinkiewicz et al. ... 257/668 |
| 5,430,441 | A | 7/1995 | Bickley et al. |
| 5,434,751 | A | 7/1995 | Cole et al. |
| 5,435,057 | A * | 7/1995 | Bindra et al. ................. 29/830 |
| 5,444,223 | A | 8/1995 | Blama |
| RE35,119 | E * | 12/1995 | Blonder et al. ............. 257/739 |
| 5,514,613 | A * | 5/1996 | Santadrea et al. ............ 438/15 |
| 5,517,752 | A | 5/1996 | Sakata et al. |
| 5,528,222 | A | 6/1996 | Moskowitz et al. |
| 5,545,291 | A * | 8/1996 | Smith et al. ................. 438/107 |
| 5,554,996 | A | 9/1996 | Chatzipetros |
| 5,557,470 | A | 9/1996 | Shibayama |
| 5,565,846 | A | 10/1996 | Geiszler et al. |
| 5,566,441 | A | 10/1996 | Marsh et al. |
| 5,574,470 | A | 11/1996 | de Val |
| D378,578 | S | 3/1997 | Eberhardt |
| 5,612,254 | A | 3/1997 | Mu et al. |
| 5,682,143 | A | 10/1997 | Brady et al. |
| 5,707,902 | A * | 1/1998 | Chang et al. ................. 438/614 |
| 5,708,419 | A | 1/1998 | Isaacson et al. |
| 5,715,594 | A | 2/1998 | Patterson |
| 5,745,984 | A * | 5/1998 | Cole et al. .................... 29/834 |
| 5,754,110 | A | 5/1998 | Appalucci et al. |
| 5,779,839 | A | 7/1998 | Tuttle et al. |
| 5,783,856 | A * | 7/1998 | Smith et al. ................. 257/618 |
| 5,798,050 | A | 8/1998 | Gaynes et al. |
| 5,818,348 | A | 10/1998 | Walczak et al. |
| 5,824,186 | A * | 10/1998 | Smith et al. ................. 438/597 |
| 5,904,545 | A | 5/1999 | Smith et al. |
| 5,910,770 | A | 6/1999 | Ohara |
| 5,914,862 | A | 6/1999 | Ferguson et al. |
| 5,995,006 | A | 11/1999 | Walsh |
| 6,018,299 | A | 1/2000 | Eberhardt |
| 6,019,284 | A | 2/2000 | Freeman et al. |
| 6,031,450 | A | 2/2000 | Huang |
| 6,040,773 | A | 3/2000 | Vega et al. |
| 6,044,046 | A | 3/2000 | Diezmann et al. |
| 6,064,116 | A * | 5/2000 | Akram ........................ 257/723 |
| 6,078,791 | A | 6/2000 | Tuttle et al. |
| 6,091,332 | A | 7/2000 | Eberhardt et al. |
| 6,094,138 | A | 7/2000 | Eberhardt et al. |
| 6,094,173 | A | 7/2000 | Nylander |
| 6,100,804 | A | 8/2000 | Brady et al. |
| 6,107,920 | A | 8/2000 | Eberhardt et al. |
| 6,122,492 | A | 9/2000 | Sears |
| 6,133,833 | A | 10/2000 | Sidlauskas et al. |
| 6,133,835 | A | 10/2000 | De Leeuw et al. |
| 6,134,130 | A | 10/2000 | Connell et al. |
| 6,147,605 | A | 11/2000 | Vega et al. |
| 6,147,662 | A | 11/2000 | Grabau et al. |
| 6,164,551 | A | 12/2000 | Altwasser |
| 6,181,287 | B1 | 1/2001 | Beigel |
| 6,189,208 | B1 * | 2/2001 | Estes et al. .................... 29/840 |
| 6,194,119 | B1 * | 2/2001 | Wolk et al. ................. 430/200 |
| 6,195,858 | B1 | 3/2001 | Ferguson et al. |
| 6,204,163 | B1 * | 3/2001 | Panchou et al. ............. 438/613 |
| 6,206,282 | B1 | 3/2001 | Hayes, Sr. et al. |
| 6,211,572 | B1 | 4/2001 | Fjelstad et al. |
| 6,219,911 | B1 * | 4/2001 | Estes et al. .................... 29/840 |
| 6,222,212 | B1 * | 4/2001 | Lee et al. .................... 257/207 |
| 6,229,203 | B1 * | 5/2001 | Wojnarowski ............. 257/668 |
| 6,229,442 | B1 | 5/2001 | Rolin et al. |
| 6,236,316 | B1 | 5/2001 | Eberhardt et al. |
| 6,246,327 | B1 | 6/2001 | Eberhardt |
| 6,252,508 | B1 | 6/2001 | Vega et al. |
| 6,262,692 | B1 | 7/2001 | Babb |
| 6,265,977 | B1 | 7/2001 | Vega et al. |
| 6,268,796 | B1 | 7/2001 | Gnadinger et al. |
| 6,274,391 | B1 * | 8/2001 | Wachtler et al. ................. 438/6 |
| 6,274,508 | B1 | 8/2001 | Jacobsen et al. |
| 6,275,156 | B1 | 8/2001 | Rasband |
| 6,275,681 | B1 | 8/2001 | Vega et al. |
| 6,281,038 | B1 | 8/2001 | Jacobsen et al. |
| 6,282,407 | B1 | 8/2001 | Vega et al. |
| 6,291,896 | B1 | 9/2001 | Smith |
| 6,297,072 | B1 * | 10/2001 | Tilmans et al. ............. 438/106 |
| 6,309,912 | B1 * | 10/2001 | Chiou et al. ................. 438/118 |
| 6,313,747 | B2 | 11/2001 | Imaichi et al. |
| 6,320,543 | B1 * | 11/2001 | Ohata et al. ......... 343/700 MS |
| 6,320,753 | B1 * | 11/2001 | Launay ...................... 361/760 |
| 6,329,917 | B1 | 12/2001 | Leonard |
| 6,357,005 | B1 | 3/2002 | Devaux et al. |
| 6,366,468 | B1 * | 4/2002 | Pan ............................ 361/761 |
| 6,384,425 | B1 | 5/2002 | Huber et al. |
| 6,392,213 | B1 | 5/2002 | Martorana et al. |
| 6,410,415 | B1 * | 6/2002 | Estes et al. .................... 438/612 |
| 6,417,025 | B1 * | 7/2002 | Gengel ...................... 438/107 |
| 6,420,266 | B1 * | 7/2002 | Smith et al. ................. 438/692 |
| 6,448,109 | B1 * | 9/2002 | Karpman ................... 438/108 |
| 6,468,638 | B2 | 10/2002 | Jacobsen et al. |
| 6,528,351 | B1 * | 3/2003 | Nathan et al. ............. 438/118 |
| 6,530,649 | B1 * | 3/2003 | Pan ............................ 347/56 |
| 6,536,674 | B2 | 3/2003 | Kayanakis et al. |
| 6,542,444 | B1 | 4/2003 | Rutscher |
| 6,559,666 | B2 * | 5/2003 | Bernier et al. ............. 324/755 |
| 6,590,346 | B1 * | 7/2003 | Hadley et al. ........... 315/169.3 |
| 6,606,247 | B2 * | 8/2003 | Credelle et al. ............. 361/737 |
| 6,611,237 | B2 * | 8/2003 | Smith ........................ 343/772 |
| 6,653,157 | B2 * | 11/2003 | Kondo ........................ 438/22 |
| 6,665,044 | B1 * | 12/2003 | Jacobsen et al. ............. 349/187 |
| 6,677,186 | B1 * | 1/2004 | Zafrany et al. ............. 438/125 |
| 6,696,785 | B2 * | 2/2004 | Shimoda et al. ........... 313/504 |
| 6,727,970 | B2 | 4/2004 | Grace et al. |
| 6,779,733 | B2 | 8/2004 | Akita et al. |
| 6,780,696 | B1 * | 8/2004 | Schatz ........................ 438/216 |
| 6,794,221 | B2 * | 9/2004 | Sayyah ...................... 438/107 |
| 6,816,380 | B2 * | 11/2004 | Credelle et al. ............. 361/736 |
| 6,841,419 | B2 * | 1/2005 | Akita et al. ................. 438/118 |
| 6,844,673 | B1 * | 1/2005 | Bernkopf .................... 313/506 |
| 6,853,087 | B2 * | 2/2005 | Neuhaus et al. ............. 257/778 |
| 6,856,086 | B2 * | 2/2005 | Grace et al. ............. 313/498 |
| 6,863,219 | B1 * | 3/2005 | Jacobsen et al. ............. 235/492 |
| 6,864,570 | B2 * | 3/2005 | Smith ........................ 257/703 |
| 6,867,983 | B2 | 3/2005 | Liu et al. |
| 6,908,295 | B2 * | 6/2005 | Thielman et al. ............. 425/371 |
| 6,919,680 | B2 * | 7/2005 | Shimoda et al. ........... 313/498 |
| 6,957,481 | B1 * | 10/2005 | Patrice ........................ 29/600 |
| 2001/0000631 | A1 * | 5/2001 | Zandman et al. ............. 257/738 |
| 2001/0031514 | A1 * | 10/2001 | Smith ........................ 438/107 |
| 2001/0035759 | A1 * | 11/2001 | Bernier et al. ............. 324/755 |

| | | | |
|---|---|---|---|
| 2001/0055835 A1 | 12/2001 | Pendse | |
| 2002/0001046 A1* | 1/2002 | Jacobsen et al. | 349/42 |
| 2002/0018357 A1* | 2/2002 | Oguchi et al. | 365/145 |
| 2002/0041234 A1* | 4/2002 | Kuzma et al. | 340/572.8 |
| 2002/0061392 A1* | 5/2002 | Jacobsen et al. | 428/210 |
| 2002/0093396 A1* | 7/2002 | Smith | 333/157 |
| 2002/0097664 A1 | 7/2002 | Hiroaki | |
| 2002/0114587 A1 | 8/2002 | Golwalker et al. | |
| 2002/0127864 A1 | 9/2002 | Smith | |
| 2002/0149107 A1 | 10/2002 | Chang et al. | |
| 2002/0167450 A1 | 11/2002 | Christian et al. | |
| 2003/0029921 A1 | 2/2003 | Akita et al. | |
| 2003/0034400 A1 | 2/2003 | Han et al. | |
| 2003/0054881 A1 | 3/2003 | Hedrick et al. | |
| 2003/0112192 A1 | 6/2003 | King et al. | |
| 2003/0136503 A1 | 7/2003 | Green | |
| 2003/0148555 A1* | 8/2003 | Akita et al. | 438/125 |
| 2003/0232174 A1* | 12/2003 | Chang et al. | 428/156 |
| 2004/0005494 A1 | 1/2004 | Forester et al. | |
| 2004/0037053 A1 | 2/2004 | Akita et al. | |
| 2004/0052202 A1 | 3/2004 | Brollier | |
| 2004/0052203 A1 | 3/2004 | Brollier | |
| 2005/0093678 A1 | 5/2005 | Forster et al. | |

FOREIGN PATENT DOCUMENTS

| | | |
|---|---|---|
| DE | 2810054 | 9/1978 |
| DE | 199 29 610 C1 | 10/2000 |
| EP | 0277606 | 8/1988 |
| EP | 0450950 | 10/1991 |
| EP | A-0450950 | 10/1991 |
| EP | 0498703 | 8/1992 |
| EP | 0 992 939 A1 | 4/2000 |
| EP | 1 014 302 A1 | 6/2000 |
| EP | 1111537 A2 | 6/2001 |
| EP | 1167068 | 1/2002 |
| EP | 1302893 | 4/2006 |
| JP | 11353439 A | 12/1999 |
| JP | 2001175837 A | 6/2001 |
| WO | WO 8802549 | 4/1988 |
| WO | WO 99/41701 A2 | 8/1999 |
| WO | WO 00/16493 | 3/2000 |
| WO | WO 00/23994 A | 4/2000 |
| WO | WO 00/52109 | 9/2000 |
| WO | WO 01/33621 A2 | 5/2001 |
| WO | WO 200162517 | 8/2001 |
| WO | WO 01/175789 A1 | 10/2001 |
| WO | WO 200175789 A1 * | 10/2001 |
| WO | WO 02/097724 A1 | 12/2002 |
| WO | WO 03/063211 | 7/2003 |
| WO | WO 2004/006259 | 1/2004 |
| WO | WO 2004/097731 | 11/2004 |
| WO | WO 2004097731 A2 | 11/2004 |

OTHER PUBLICATIONS

PCT International Search Report for PCT Application No. PCT/US2005/002534. Mailed on Nov. 11, 2005, (7 pages).
PCT Written Opinion Report for PCT Application No. PCT/US2005/002534. Mailed on Nov. 11, 2005, (7 pages).
PCT International Written Opinion, PCT Application No.: PCT/US03/02115 (4 pages).
PCT Notification of Transmittal of International Search Report and The Written Opinion of the International Searching Authority, or the Declaration for PCT/US2005/040772, mailed on Jul. 26, 2006 (15 pages).
Kriebel, Frank (2005). RFID Chip and Tag Assembly Challenges: Low Cost RFID IC Packaging and Assembly Workshop, Nov. 14, 2005, Munich, Germany. (12 pgs).
IPRP Chapter 1, PCT Application No. PCT/US2005/002534, (9 pages) mailed Aug. 10, 2006.
PCT Notification of Transmittal of International Search Report and The Written Opinion of the International Searching Authority for PCT/US2004/09070, mailed on Feb. 10, 2005 (12 pages).
PCT international Written Opinion, PCT Application No. PCT US02/16474. Mailed Oct. 2002.
PCT international Written Opinion, PCT Application No. PCT US03/02115. (4 pages).
PCT international Search Report, PCT Application No. PCT US2005/002534. Mailed Nov. 11, 2005.
PCT Written Opinion Report, PCT Application No. PCT US2005/002534. Mailed Nov. 11, 2005 (7 pages).
PCT Notification of Transmittal of International Preliminary Examination report for PCT Application No. PCT US02/16474. Mailed Jul. 21, 2005 (5 pages).
IPRP Chapter 1, PCT Application No. PCT/US2004/009070, (7 pages) mailed Oct. 13, 2005.

* cited by examiner

APPARATUS INCORPORATING SMALL-FEATURE-SIZE AND LARGE-FEATURE-SIZE COMPONENTS AND METHOD FOR MAKING SAME

RELATED APPLICATION

This is a continuation in part of U.S. patent application Ser. No. 10/056,192, filed on Jan. 23, 2002 entitled "Apparatus incorporating small-feature-size and large-feature-size components and method for making same". The mentioned Application is hereby incorporated by reference in its entirety.

BACKGROUND OF THE INVENTION

1. Field of the Invention

The field of the invention generally relates to apparatuses having both large-feature-size components and small-feature-size components, and methods of making such apparatuses. The invention more particularly relates to combination of VLSI integrated circuits and macro-scale components to form a single device.

2. Description of the Related Art

VLSI provides many effective methods for creation of microscopic-scale and smaller components. Such miniaturization provides many advantages in terms of speed of operation, size of footprint, amount of necessary resources, and speed of manufacture for electronic devices.

Unfortunately, some components of electronic devices are not well-suited to formation through well-known VLSI processes. These components often are necessarily very large (macroscopic-scale) relative to devices or components of devices formed through VLSI. One such component is an antenna, which may need to have a characteristic length to allow for adequate transmission on a preferred frequency, and for which the characteristic length in question may be appropriately measured in centimeters or meters, for example. Formation of a conductor for use as an antenna using VLSI tends to waste time and material resources, as a 30 cm conductor (for example) can easily be formed through less expensive processes.

Thus, the problem then becomes a matter of combining a large-scale component such as an antenna with a small-scale component such as an integrated circuit. For a conventional radio, this may involve use of packaging for the integrated circuit, conductors on a printed circuit board, a connector attached to the printed circuit board, and an antenna attached to the connector. This approach is simple enough for a device having rigid packaging and flexible size constraints. However, other applications may have more demanding requirements for size and materials cost.

In particular, it may be useful to have a small radio-transmitter with flexible materials allowing for bending and other abusive actions without degradation in functionality. Similarly, such a small radio-transmitter may need to be producible rapidly in quantities of millions or billions, thus requiring ease of assembly and relatively inexpensive materials on a per-unit basis. Using a printed-circuit board approach for such a radio-transmitter will likely not succeed. Moreover, avoiding such time (and/or space) consuming processing operations as thermal cure may be advantageous.

It is possible to separately produce elements, such as integrated circuits and then place them where desired on a different and perhaps larger substrate. Prior techniques can be generally divided into two types: deterministic methods or random methods. Deterministic methods, such as pick and place, use a human or robot arm to pick each element and place it into its corresponding location in a different substrate. Pick and place methods place devices generally one at a time, and are generally not applicable to very small or numerous elements such as those needed for large arrays, such as an active matrix liquid crystal display. Random placement techniques are more effective and result in high yields if the elements to be placed have the right shape. U.S. Pat. Nos. 5,545,291 and 5,904,545 describe methods that use random placement. In this method, microstructures are assembled onto a different substrate through fluid transport. This is sometimes referred to as fluidic self assembly (FSA). Using this technique, various integrated circuits, each containing a functional component, may be fabricated on one substrate and then separated from that substrate and assembled onto a separate substrate through the fluidic self assembly process. The process involves combining the integrated circuits with a fluid, and dispensing the fluid and integrated circuits over the surface of a receiving substrate that has receptor regions or openings. The integrated circuits flow in the fluid over the surface and randomly align into receptor regions, thereby becoming embedded in the substrate.

Once the integrated circuits have been deposited into the receptor regions, the remainder of the device can be assembled. Typically, this involves coating the substrate with a planarization layer to provide electrical insulation and physical retention for the integrated circuits. The planarization layer creates a level surface on top of the substrate by filling in the portions of the receptor regions that are not filled by integrated circuits. After the planarization layer has been deposited, other elements, including pixel electrodes and traces for example, may be installed.

Using FSA, the functional components of the device can be manufactured and tested separately from the rest of the device.

SUMMARY OF THE INVENTION

The embodiments of the present invention relates generally to the field of fabricating elements on a substrate. One embodiment pertains to an apparatus that includes a substrate having embedded, contained, or incorporated therein an integrated circuit. The integrated circuit is attached to a first conductor disposed on the substrate. The first conductor can be a thermosetting or a thermoplastic material. The apparatus also includes a large-scale component attached to the first conductor; the large-scale component is thus electrically coupled to the integrated circuit. The large-scale component includes a second substrate.

Another embodiment pertains to a method that includes attaching a conductive medium to a substrate having embedded or contained therein an integrated circuit such that the conductive medium is connected electrically to the integrated circuit. The method further includes a conductive medium attached to the first conductor of the integrated circuit. The method also includes attaching a large-scale component to the conductive medium such that the large-scale component is electrically connected to the integrated circuit.

In other embodiments, various methods and materials used to attach the large-scale component to the first conductor are described. In some embodiments, anisotropically conductive materials are used to attach the conductor from the large-scale component to the first conductor on the substrate that has an integrated circuit (IC) contained or embedded therein so that there is an electrical and physical connection between the large-scale component and the IC. In other embodiments, isotropically conductive materials are used to attach the conductor from the large-scale component to the first conductor on the substrate that has the IC contained or embedded therein so that there is an electrical and physical connection between the IC and the large-scale component. In some embodiments, the conductor on the substrate that has the IC contained or embedded therein and the conductor of the large-scale component are connected using mechanical methods to keep the conductors in intimate contact. Such mechanical methods include crimping, clinching, pressing, ultrasonic energy, heat and pressure, taping, compressing, stapling, punching, riveting, thermosonic bonding, and thermo-compression bonding methods. These mechanical methods bring the conductors into an immediate contact to allow for the necessary electrical interconnection between the large-scale component and the IC.

BRIEF DESCRIPTION OF THE DRAWINGS

The present invention is illustrated by way of example and not limitation in the accompanying figures.

DETAILED DESCRIPTION

Figure 1:
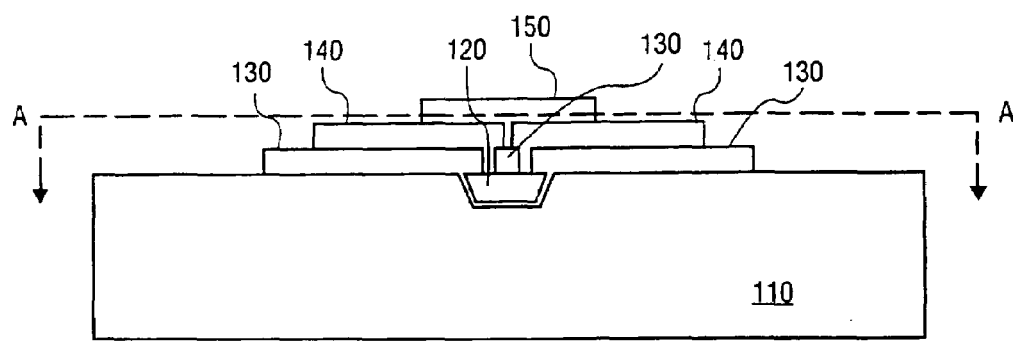
FIG. 1 illustrates a side view of an embodiment of a strap.

An apparatus incorporating small-feature-size and large-feature-size components and method for making same is described. In the following description, for purposes of explanation, numerous specific details are set forth in order to provide a thorough understanding of the invention. It will be apparent to one skilled in the art, however, that the invention can be practiced without these specific details. In other instances, structures and devices are shown in block diagram form to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments.

Embodiments of the present invention relate generally to the field of fabricating elements on a substrate. In one embodiment, the invention is an apparatus. The apparatus includes a strap, comprising a substrate with an embedded integrated circuit (IC) embedded or contained therein. A first conductor is disposed on the substrate and attached to the IC. A conductive medium is attached to the strap at the first conductor. The apparatus also includes a large-scale component attached to the conductive medium, which allows the large-scale component to be electrically coupled to the integrated circuit. The large-scale component may include a second conductor that attaches to the conductive medium to electrically couple the large-scale component to the IC. The large-scale component may be included in another substrate. The substrate of the strap and the substrate carrying the large-scale component may be flipped over on top of one another to facilitate the coupling of the large-scale component to the IC. In one embodiment, the IC has an active surface. The active surface can be the IC surface where the first conductor can be attached to the IC. In one embodiment, the active surface faces the large scale component.

Some embodiments of the invention relate to a method of making an assembly. The method includes creating a strap by attaching a first conductor to a substrate that has an integrated circuit contained or embedded therein such that the first conductor is connected electrically to the integrated circuit. The method also includes attaching a large-scale component to the first conductor such that the large-scale component is electrically connected to the integrated circuit. In some embodiments, a second conductor is included in the large-scale component. The second conductor connects electrically to the first conductor. In some embodiments, a conductive medium is used to connect the first conductor to the second conductor.

There are many ways that the first conductor and/or the conductive medium can be formed. The materials used to form the first conductor and/or the conductive medium may be applied by screen printing (e.g., flat bed screen printing or rotary screen printing), stencil printing, ink jet printing, gravure printing, flexography printing, pad stamping, electrostatic printing, laminating, hot pressing, laser assisted chemical vapor deposition, physical vapor deposition (e.g., sputtering), shadow masking, evaporating, extrusion coating, curtain coating, electroplating, or other additive techniques. The materials may also be applied by metering an appropriate amount of material (e.g., through a needle, nozzle, or pipette, or another convenient metering tool) onto a particular substrate or surface.

The conductive medium may be a fluid, ink (silver ink, of a thermoplastic or thermoset resin base), electrically conductive tape (thermoplastic or thermosetting polymer with conductive fillers), electrically conductive paste (solder paste or conductive fillers in a polymer matrix), solder, metal film, metal particles suspended in a carrier, conductive polymer, carbon-based conductor, or other thick-film material for example. One exemplary conductive medium product is Acheson Colloids 479SS.

In another alternate embodiment, the invention is an apparatus. The apparatus includes an integrated circuit embedded within a substrate. The apparatus also includes a dielectric layer formed over a portion of the integrated circuit and a portion of the substrate. The apparatus further includes a first conductor formed over a portion of the dielectric layer, the first conductor having direct electrical connection with the integrated circuit. The apparatus is called a strap.

In yet another alternate embodiment, the invention is a method. The method includes forming a dielectric on a portion of an integrated circuit and a portion of a substrate, the integrated circuit embedded within the substrate. The method also includes attaching a first conductor to the dielectric and to the integrated circuit, the first conductor electrically connected to the integrated circuit.

In still another alternate embodiment, the invention is an apparatus. The apparatus includes a substrate having embedded or contained therein an integrated circuit. A first conductor is attached to the substrate and the integrated circuit is attached to the first conductor. This apparatus is referred to as a strap. The apparatus also includes a conductive medium attached to the first conductor of the integrated circuit.

In yet another alternate embodiment, the invention is an apparatus. The apparatus includes a strap having embedded therein a functional block such as a NanoBlock IC. A functional block is a small structure or a microstructure that includes an integrated circuit that can drive a particular device and a first conductor electrically coupled to the NanoBlock IC. The NanoBlock IC may have been produced using conventional VLSI procedures and embedded using fluidic self-assembly (FSA), for example. The NanoBlock IC may also be attached or contained in the substrate by other transferring methods. The substrate has attached thereon a conductive medium, allowing for electrical coupling between the NanoBlock IC and the first conductor. The conductive medium is electrically connected to the first conductor. Attached to the conductive medium is a substrate including an antenna, allowing for electrical coupling between the antenna and the NanoBlock IC.

Although the discussion herein focuses on the NanoBlock IC as the IC that is being incorporated, contained, embedded, or included in the substrate, it is to be expected that other functional blocks can be used instead.

In still another alternate embodiment, the invention is a method. The method includes attaching a first conductor to a substrate having embedded therein a NanoBlock IC such that the first conductor is coupled electrically to the NanoBlock IC, thereby forming a strap. The method further includes attaching a large-scale component to the first conductor such that the large-scale component is electrically connected or coupled to the first conductor. The method may also include a conductive medium disposed between the first conductor and the large-scale component to interconnect the NanoBlock IC to the large-scale component. The method may further include fabricating the NanoBlock IC and performing FSA to embed the NanoBlock IC into the substrate, in one embodiment. The method may also involve a large-scale component which may be an antenna, a power source such as a battery or a button cell, or a thick-film cell printed on the strap or other substrate; a display electrode or a display; a logic device, or a sensor; among other examples.

In a further alternate embodiment, the invention is an apparatus. The apparatus includes a substrate having embedded or contained therein a NanoBlock IC. The substrate has attached thereto a first conductor, which allows for electrical connection between the NanoBlock IC and a conductive medium. The conductive medium is attached to another a substrate such as an antenna. The conductive medium allows for electrical coupling between the antenna and the NanoBlock IC.

For purposes of the discussion in this document, the embodiments may involve a strap having a NanoBlock IC deposited therein. However, other functional blocks or other IC devices may be used instead without affecting the scope of the embodiments. In addition, the NanoBlock IC or other IC devices may be embedded within the strap or otherwise contained, included, or incorporated in the strap.

FIG. 1 illustrates a side view of an embodiment of a strap, including a substrate with an embedded functional block IC such as a NanoBlock IC, planarizing layer, and first conductor that contacts the NanoBlock™ IC. The NanoBlock IC includes at least one conducting pad as is known in the art. The first conductor contacts the NanoBlock IC by contacting the conducting pad. The substrate 110 has an opening in it to contain a functional block or the NanoBlock IC 120, and may be a flexible plastic substrate for example. In one embodiment, the IC 120 is a NanoBlock IC formed via conventional VLSI. The NanoBlock IC 120 may be embedded or deposited in the opening of the substrate 110 through FSA in one embodiment, or by other transferring methods in other embodiments. The IC 120 can also be transferred to the substrate 110 by other methods such as pick-and-place. The IC can also be contained in the substrate 110 using other methods such as using a tool that can press the IC 120 into the substrate 110 or attaching the IC 120 to the substrate 110 by other convenient methods.

The NanoBlock IC 120 may have a variety of functions or structures consistent with an integrated circuit. In one embodiment, the NanoBlock IC 120 includes circuitry suitable for receiving radio signals from an external antenna and sending radio signals via the external antenna. The NanoBlock IC 120 also has an active surface such as the surface that has the circuitry of the NanoBlock IC 120. Moreover, in one embodiment, the NanoBlock IC 120 may receive power from an external source via an external antenna, and use such power to send a radio signal via the external antenna. It is to be appreciated that even though the discussion focuses on the NanoBlock IC 120, other IC can be used instead and that the embodiments are not limited to the NanoBlock 120.

Formed above the NanoBlock IC 120 is a planarization layer 130, which may be formed through a conventional lamination or coating of an organic dielectric, pattern and etch or other similar method, for example. Formed above the planarization layer 130 are two first conductors 140, which may be formed from a screen-printed electrically conductive paste for example, and which occupy two contact holes in the planarization layer 130. In one embodiment, the two first conductors 140 attach to the conductive pads of NanoBlock IC 120, and the two first conductors 140 preferably do not directly connect to each other.

In one embodiment, the first conductors 140 are formed from a thermosetting ink that contains conductive fillers (e.g., conductive metals such as silver or polymers that are intrinsically conducting polymers (ICP), such as polyaniline) dispersed in a thermosetting polymer. Alternatively, first conductors 140 are formed from a thermoplastic ink that contains similar conductive fillers as the thermosetting ink dispersed in a thermoplastic polymer. In some embodiments, conductive fillers are not needed such as when the thermosetting material or the thermoplastic material is inherently conductive.

The conductive thermosetting ink used to form the first conductors 140 may be a one-part starting material, a two-part starting material or a multiple-part polymerizable starting material. After the thermosetting ink is deposited, it can be cured by exposure to reactive species such as oxygen, to heat, to moisture, or by exposure to an electromagnetic radiation such as IR, visible, UV, electron beams, RF, and microwave frequency.

The conductive thermoplastic ink used to form the first conductors 140 can be deposited as a softened polymer (by applying heat) and allowed to solidify. In some embodiments, the first conductors 140 may be formed with the conductive thermoplastic ink and solidified to form the first conductor 140. The first conductors 140 are being bonded to other conductors (such as conductors of a large-scale component). These embodiments allow for a direct electrical connection between the first conductors 140 and other conductors. In other embodiments, the conductive thermoplastic ink may be softened with an appropriate solvent in order to transfer/deposit the conductive thermoplastic ink in its softened form and then allow the softened thermoplastic ink to solidify to form the first conductors 140. Using the conductive thermoplastic ink may eliminate the need for an intermediate conductive medium 270 to electrically connect the first conductors 140 to other conductors (e.g., conductors 280 of a large-scale component below) since the thermoplastic material can be directly bonded to another conductor as it solidifies. These embodiments allow a direct electrical connection between the first conductors 140 and the other conductors.

The first conductors 140 can also be formed by other conductive materials such as silver, aluminum, or copper. The first conductors 140 can be deposited by various techniques known in the art such as physical vapor deposition (e.g., sputtering), chemical vapor deposition or low-pressure vapor deposition, screen printing (e.g., flat bed screen printing or rotary screen printing), stencil printing, ink jet printing, gravure printing, flexography printing, electrostatic printing, laminating, hot pressing, laser assisted chemical vapor deposition, shadow masking, evaporating, extrusion coating, curtain coating, electroplating, or other additive techniques. In one embodiment, the first conductor 140 is made from a conductive paste (such as those available from Acheson, including 479SS) and can be formed or deposited on the substrate 110 through a screen printing process, for example. In another embodiment, the first conductors 140 can be formed by pad transferring where preformed conductive pads are picked up by a robotic tool and transferred to the substrate 110 to form the first conductors 140. The conductive pads are typically transferred in their softened state and allowed to be cured or solidified after being transferred onto the substrate 110.

In one embodiment, an insulating layer 150 is formed above the first conductors 140. This insulating layer 150 may be formed through a thin-film or thick-film process for example, and may fill in space between the two first conductors 140. As will be appreciated, the first conductor 140 may in some instances connect to multiple pads of an integrated circuit by design. One example of such a situation is connecting all ground pads of an IC to a single conductor to achieve a common ground potential.

In some embodiments, thin films are applied through use of vacuum or low-pressure processes. Thick films are applied using non-vacuum processes, typically at or near atmospheric pressure. One having skill in the art will appreciate that exact magnitudes of ambient pressure for low-pressure of vacuum as opposed to atmospheric pressure may be difficult to state. However, one having skill in the art will also appreciate that the differences between low-pressure and atmospheric pressure are relatively large compared to atmospheric pressure.

In some embodiments, the NanoBlock IC 120 are formed with sufficiently large pads as to allow for direct connection between the first conductors 140 and other conductors (e.g., second conductors 280 of a large-scale component 281, FIG. 2) and the NanoBlock IC, thereby avoiding the requirement of an intermediate or intervening conductor. In other embodiments, direct (vertical) connection between any large-scale component and the NanoBlock IC is made through conductors that have isotropic conductivity.

Figure 2:
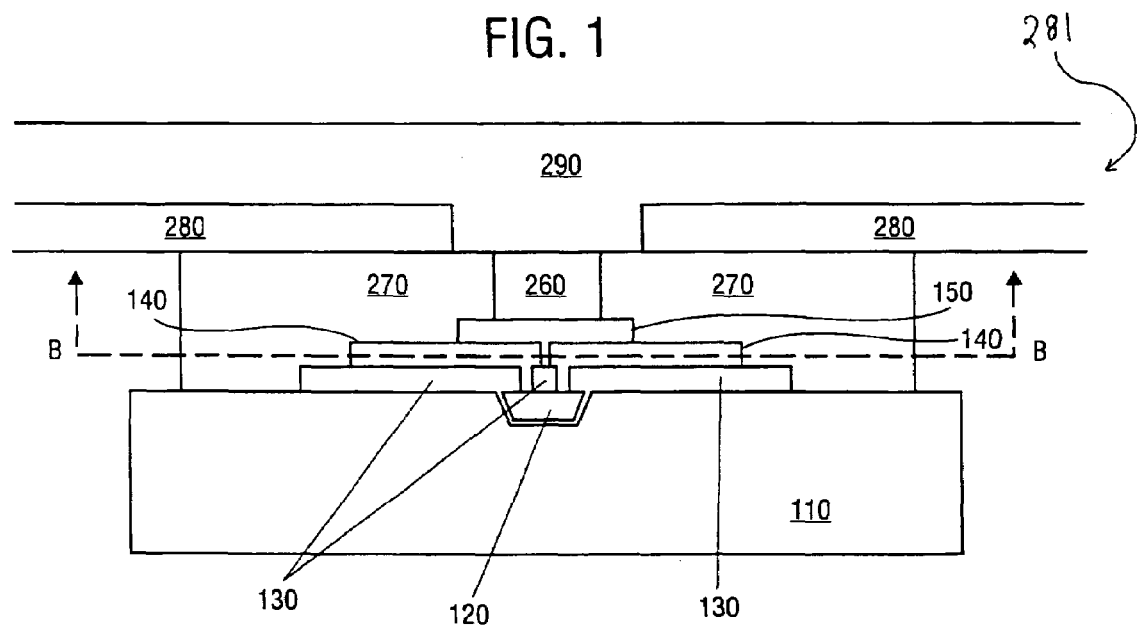
FIG. 2 illustrates a side view of an embodiment of the strap of FIG. 1 as attached to a large-scale component.

FIG. 2 illustrates a side view of an embodiment of the strap of FIG. 1 as attached to a large-scale component 281. The large-scale component discussed in this application may be an antenna, an electronic display or display electrode, a sensor, a power source such as a battery or solar cell, or another logic or memory device (such as but not limited to microprocessors, memory, and other logic devices), for example.

In attaching the strap to the large-scale component 281, the first conductors 140 are electrically coupled to other conductors provided on the large-scale components and in one embodiment, electrically coupled to second conductors 280. In one embodiment, the first conductors 140 are electrically coupled to the second conductors 280 through a conductive medium 270. In one embodiment, the conductive medium 270 includes two conductors 270 or alternatively, at least two conductors 270.

In one embodiment, the conductors 270 each have a direct connection to one of the first conductors 140, and potentially having a contact to one or more of the insulating layer 150, the planarization layer 130, and the substrate 110. Attached to each of the conductive media 270 are one of the second conductors 280, which may be conductive pads of an antenna or conductive ends of an antenna for example. Alternatively, the second conductor may be a conductor of other devices such as an electronic device, display electrode, sensor, power source, and logic/memory device. In one embodiment, there are two or alternatively, at least two second conductors 280. Thus, as illustrated, each of the second conductors 280 may be said to be coupled (electrically) to the NanoBlock IC 120. The conductive medium 270 acts as an intermediate conductor for the first conductors 140 and the second conductors 280. In one embodiment, a substrate 290 is the material in which the conductors 280 are embedded or to which the conductors 280 are attached, and is preferably insulating in nature. The substrate 290 and the second conductors 280 thus constitute the large-scale component 281 in one embodiment.

A space 260 is a space between the two conductors 270, which may be occupied by the substrate 290 and/or the insulator 150, may be left as a void in the structure, or may be filled by the conductive medium 270 if anisotropic in nature, for example. It is important to note that in most applications, each of the two conductive media 270 would not be connected directly to the other conductive media 270, and a similar statement may be made with respect to the two second conductors 280.

In embodiments where the conductive medium 270 is isotropic, areas that need not be conductive can be deactivated using appropriate chemicals or using conventional patterning techniques (e.g., etching). For instance, a layer of an isotropic material can be blanket-deposited over the first conductors 140 to form a conductive layer for the conductive medium 270. The isotropic material deposited over the area that need not be conductive, such as the space 260, can be deactivated leaving the conductive area referred to as the conductive medium 270.

In one embodiment, the conductive medium 270 is an electrically conductive tape (such as those available from the 3M Corporation, including 3M Z-Axis 7303, for example). Moreover, the conductive tape may be isotropically or anisotropically conductive. Such a conductive tape may be applied (adhered) by rolling the tape along a row of straps, applying sufficient pressure and possibly heat to adhere the tape to the straps, and then cutting the through the tape and the strap to separate the individual straps. This may be done in various manners.

Alternatively, the conductive medium 270 may be made from a conductive paste (such as those available from Acheson, including 479SS), which is deposited through a screen printing process, for example. In one embodiment, the conductive paste is screen printed on to the straps (e.g., on the substrate 110 portion of the strap and on at least portions of the first conductor 140) at moderate resolutions relative to overall manufacturing tolerances, thereby allowing for useful connection of the conductive medium 270 to the first conductors 140. Furthermore, the conductive medium 270 may also be made using metal particles suspended in a polymer carrier such as a thermoplastic material or a thermosetting material, a conductive polymer, a carbon-based conductor, a solder, or other conductive medium as will be appreciated by those skilled in the art.

In an alternative embodiment, the conductive medium 270 is a polymerized film having conductive particles suspended therein. The conductive particles can be metals or conductive fibers (e.g., carbon). Alternatively, the conductive particles can have a nonconductive core of various shapes, such as spheres or long continuous fibers that are coated with a conductive material. Alternatively, the conductive particles can be carbon nanotubes. In addition, the polymerized film can be a thermosetting material or a thermoplastic material.

In some embodiment, the conductive medium 270 is made of particles suspended in a carrier, conductive polymers, pastes, silver inks, carbon-base conductors, solders, and other suitable conductive materials.

In another embodiment, the conductive medium 270 is a pressure sensitive adhesive (PSA) with conductive fillers (e.g., silver flake or particle, metals, fibers coated with conductive materials, or glass beads coated with conductive materials). Having the conductive medium 270 being a PSA with the conductive fillers provides a soft conformal layer between two rigid layers (e.g., the first conductor 140 and another conductor (e.g., the second conductors 280) to facilitate better contact. One advantage of using a PSA film having the conductive fibers is that only a small amount of pressure (e.g., less than 25 psig) is needed to cause the connection between the first conductors 140 and the conductive medium 270 and or between the conductive medium 270 and the second conductors 280.

Figure 15:
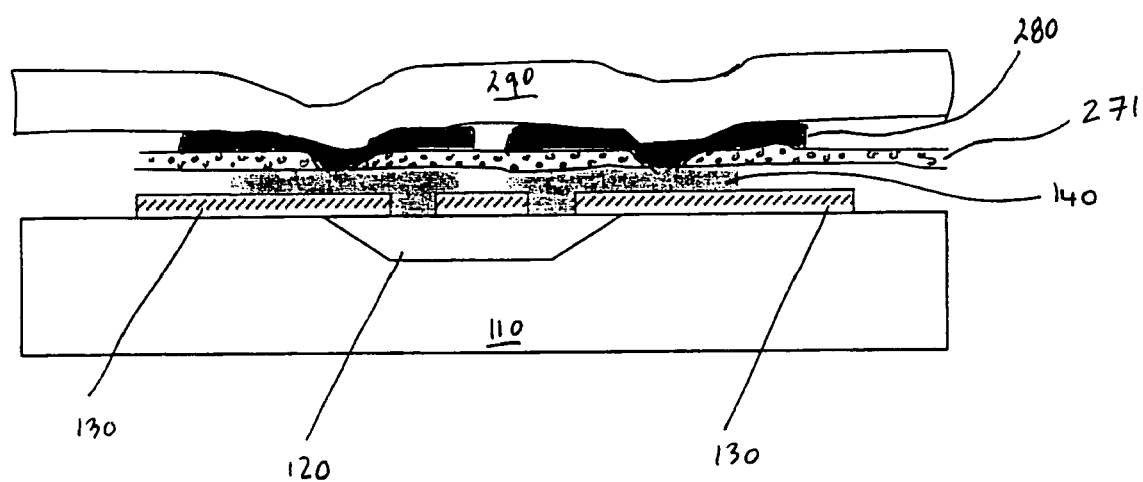
FIG. 15 illustrates a side view of an embodiment of connecting conductors of a strap to conductors of a large-scale component.

In another embodiment, instead of using the conductive medium 270 as the intermediate conductor to connect the first conductors 140 and the second conductor 280, the conductive medium 270 is replaced with a non-conductive adhesive 271 as shown in FIG. 15. In this embodiment, heat and pressure are used to "rupture" a portion of the non-conductive adhesive 271 as shown in FIG. 15 so that the second conductors 280 and the first conductors 140 are brought into immediate contact with each other. Thus, portions of the non-conductive adhesive 271 are locally pressed and heated so that they are thinned out or ruptured to allow the second conductors 280 to contact the first conductors 140. In one embodiment, the non-conductive adhesive 271 functions to hold together substrate 290 (a substrate of a large-scale component 281) and substrate 110 while being ruptured at the portions that are dedicated for contact between the second conductors 280 and the first conductors 140. In another embodiment, the non-conductive adhesive 271 functions to hold together portions of the first conductors 140 and the conductor second 280 as shown in FIG. 15 and are capacitively coupled. In one embodiment, crimping or pressing can be used to selectively press down on the substrate 290 to cause rupture in the non-conductive adhesive 271 at the crimped or pressed portions. The second conductors 280 get pressed into the ruptured part and are pressed in contact with the first conductors 140 as shown in FIG. 15. In one embodiment, the non-conductive adhesive 271 is a thin layer of adhesive that can be ruptured when selectively crimped or pressed.

In one embodiment, the first conductors 140 are formed on the substrate 110 as previously described. The non-conductive adhesive 271 is disposed between the second conductors 280 and the first conductors 140 as an intervening layer. The non-conductive adhesive 271 can be a hot melt or pressure sensitive adhesive film, for example. The assembly is then mechanically crimped together, with or without heat and pressure, in such a fashion to cause the second conductors 280 to bend and pierce or penetrate through the non-conductive adhesive 271 creating an intimate connection between the first conductors 140 and the second conductors 280.

Figure 10:
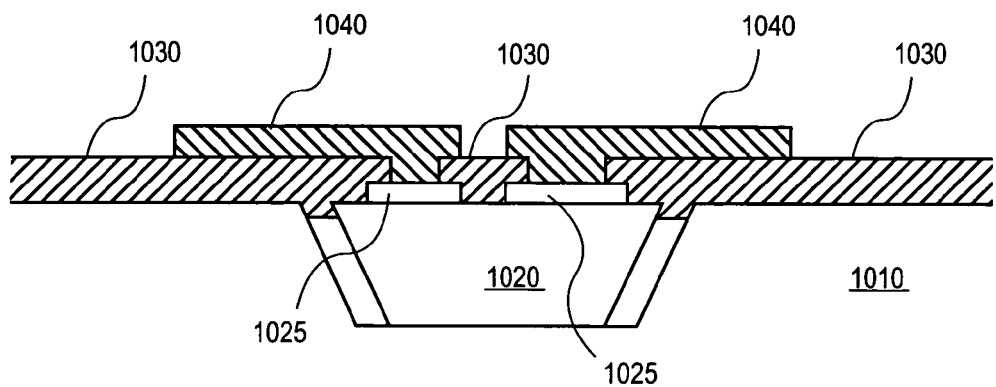
FIG. 10 illustrates a side view of still another alternate embodiment of a strap.
Figure 16:
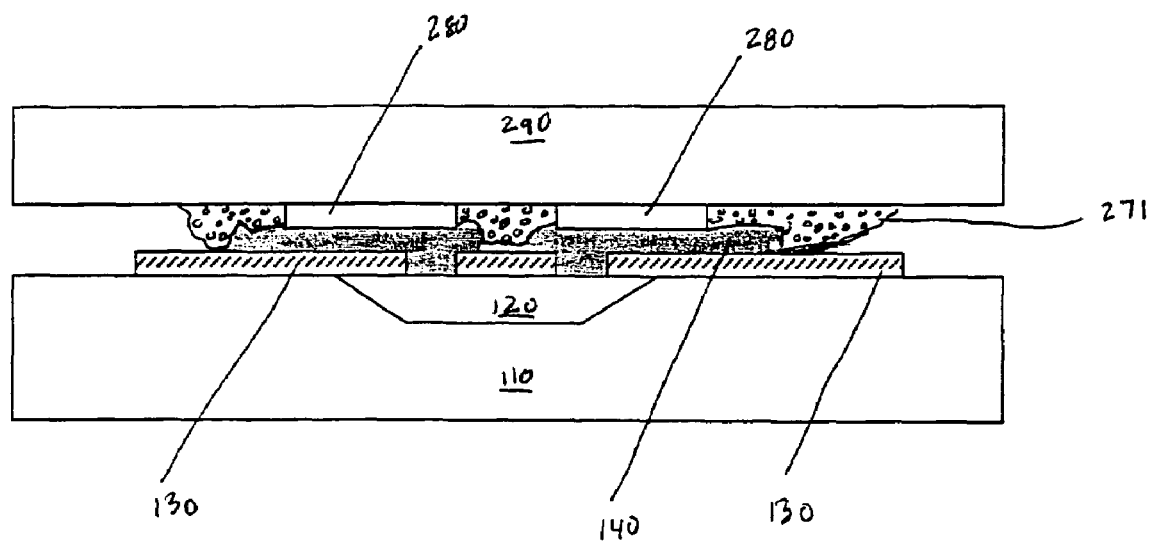
FIG. 16 illustrates a side view of another embodiment of connecting conductors of a strap to conductors of a large-scale component.

In another embodiment, the non-conductive adhesive 271 is used to form an edge-seal for the second conductors 280 and the first conductors 140 as shown in FIG. 16. The edge-seal will keep the second conductors 280 and the first conductors 140 in intimate contact and as such, an intermediate conductor (e.g., the conductive medium 270) is not necessary. In this embodiment, a thin layer of adhesive is first deposited between the second conductors 280 and the first conductors 140. A mechanical technique that will press the substrate 290 close to the substrate 110 is then used to press down on the assembly. As the substrate 290 and the substrate 110 are pressed together, the non-conductive adhesive 271 is pressed to the sides or edges of the first conductors 140 and second conductors 280. In one embodiment, where the first conductors 140 and second conductors 280 contact, the non-conductive adhesive 271 is selectively pressed or compressed to cause it to migrate or flow to the edges of the first conductors 140 and second conductors 280 to allow the first conductors 140 and second conductors 280 to electrically connect as shown in FIG. 10.

The non-conductive adhesive 271 can be a hot-melt adhesive, a pressure sensitive adhesive, an electromagnetic radiation curable adhesive, (e.g., UV, IR, visible, RF, or microwave curable adhesive), a heat curable adhesive, a thermosetting material, a thermoplastic material, or a material that can flow out under pressure and/or heat to form an edge-seal upon solidifying. The non-conductive adhesive 271 can be deposited either directly on the second conductors 280 and/or the first conductors 140 in its uncured or softened state and allowed to cure or solidify after the substrate 110 and the substrate 290 are pressed together. As the non-conductive adhesive 271 solidifies, it forms edge-seals around the first conductors 140 and second conductors 280 to keep these two conductors in immediate contact with each other for the electrical connection.

Figure 17A:
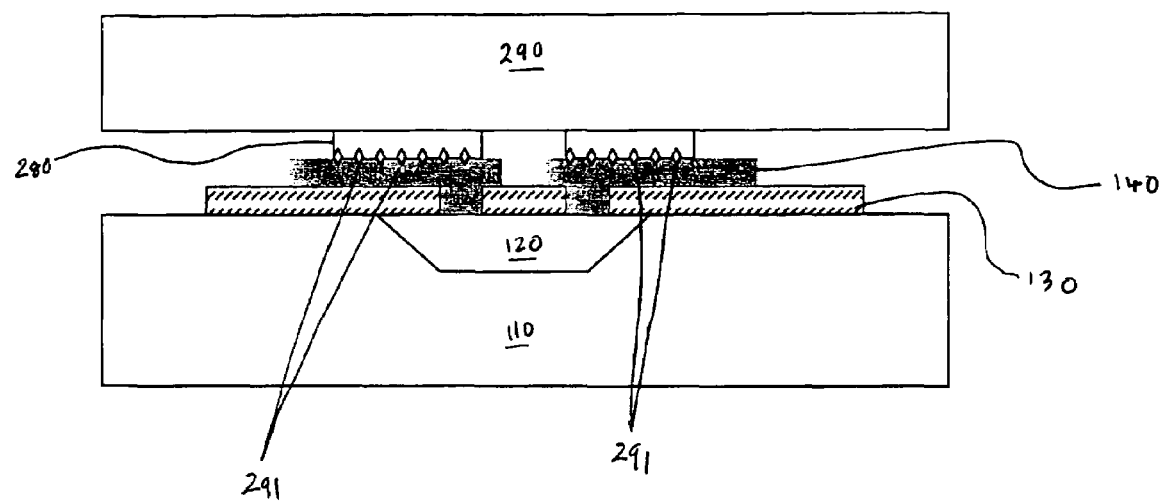
FIGS. 17A–17C illustrate side view of other embodiments of connecting conductors of a strap to conductors of a large-scale component.
Figure 17B:
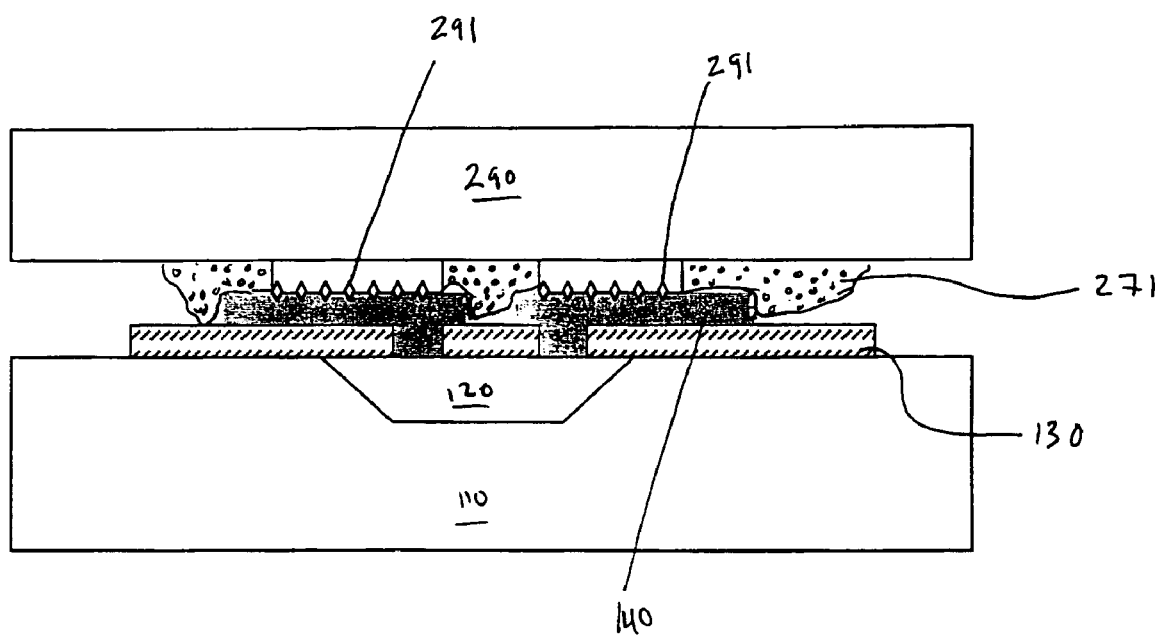
Figure 17C:
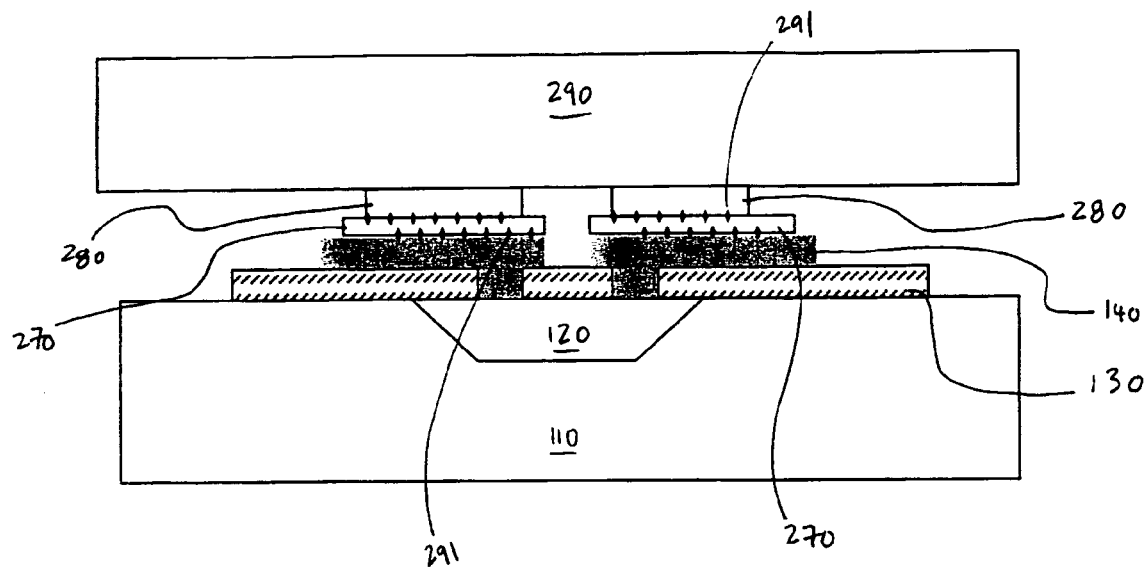

In any of the embodiments previously discussed, small and sharp particles 291 as shown in FIG. 17A–17C can be incorporated to enhance the physical interconnection and/or the electrical interconnection between the first conductors 140 and the second conductors 280, either directly or through the use of the intermediate layer (e.g., the conductive medium 270 or the non-conductive adhesive 271). The particles 291 are especially advantageous when the first conductors 140 and the second conductors 280 may contain a small residue of either contaminates or oxide that may hinder the connection. The small and sharp particles (e.g., fine diamond, glass, or any other hard, small particles that have irregular shapes) can be blended with the conductive ink or paste or the non-conductive adhesives. The conductive ink/paste or the non-conductive adhesive can then be screen-printed or stencil printed or dispensed as previously described. In one embodiment, during the bonding process of the first conductors 140 to the second conductors 280, the particles will penetrate through the surface and abrade the contamination and thus improve the contact or connection made to the first conductors 140 and the second conductors 280. In another embodiment, the small and sharp particles 291 can act as mechanical interlocks to enhance the connection as shown in FIGS. 17A–17C.

In one embodiment, as shown in FIG. 17A, the small and sharp particles (e.g., diamonds) 291 are dispensed in the conductive pastes or inks that are used to form the first conductors 140 or the second conductors 280. In this embodiment, the first conductors 140 and second conductors 280 are to be directly connected to each other without the use of an intermediate layer. In one embodiment, the small and sharp particles (e.g., diamonds) 291 are dispensed in a thermosetting ink having conductive fillers that is used to form the first conductors 140 or the second conductors 280. In another embodiment, the small and sharp particles (e.g., diamonds) 291 are dispensed in a thermoplastic ink having conductive fillers that is used to form the first conductors 140 or the second conductors 280. The particles 291 for the thermoplastic ink may be slightly larger in size to compensate for the softening of the ink. The thermosetting ink having the particles 291 or the thermoplastic ink having the particles 291 is then allowed to solidify using methods previously mentioned or other convenient methods to form the first conductors 140 or the second conductors 280. After the first conductors 140 or the second conductors 280 are solidified, the small and sharp particles 291 reside at the surfaces of the first conductors 140 or the second conductors 280. These particles 291 then act as mechanical interlock to help maintaining the contact between the first conductors 140 and the second conductors 280. In an alternative embodiment, the particles 291 are coated with a conductive material to further enhance or ensure the electrical interconnection between the first conductors 140 and the second conductors 280.

In another embodiment, the sharp and small particles 291 are incorporated into a non-conductive adhesive 271 and the substrate 110 and the substrate 290 are pressed together such that the non-conductive adhesive 271 are pushed to the outer edges of the first conductors 140 and the second conductors 280 as shown in FIG. 17B. In this embodiment, the first conductors 140 and second conductors 280 are directly connected to each other without the use of an intermediate layer. The non-conductive adhesive 271 can be a thin layer of adhesive and can first be deposited between the second conductors 280 and the first conductors 140. A mechanical technique that will press the substrate 290 close to the substrate 110 is then used to press down on the assembly. As the substrate 290 and the substrate 110 are pressed together, the non-conductive adhesive 271 is pressed to the sides or edges of the first conductors 140 and second conductors 280. In one embodiment, where the first conductors 140 and second conductors 280 contact, the non-conductive adhesive 271 is selectively pressed or compressed to cause it to migrate/flow to the edges of the first conductors 140 and second conductors 280 to allow the first conductors 140 and second conductors 280 to electrically connect.

The non-conductive adhesive 271 can be a hot-melt adhesive, a pressure sensitive adhesive, an electromagnetic radiation curable adhesive, (e.g., UV, IR, visible, RF, or microwave curable adhesive), a thermosetting material, or a thermoplastic material. The non-conductive adhesive 271 can be deposited either directly on the second conductors 280 and/or the first conductors 140 in its uncured or softened state and allowed to solidify after the substrate 110 and the substrate 290 are pressed together. As the non-conductive adhesive 271 solidifies, it forms edge-seals around the first conductors 140 and second conductors 280 to keep these two conductors in immediate contact with each other for the electrical connection. In addition, the small particles 291 function as the mechanical interlock that further maintains the attachment between the first conductors 140 and the second conductors 280.

In one embodiment, the particles 291 are incorporated into a conductive medium 270. The particles 291 will reside at the surfaces of the conductive medium 270, as shown in FIG. 17C. The particles 291 provide an added mechanical interlocking feature for the conductive medium 270. As previously described, the conductive medium 270 can be a polymerized film having conductive particles suspended therein such as a thermosetting ink having conductive fillers or a thermoplastic having conductive fillers. The conductive medium 271 acts as an intermediate conductor for the first conductors 140 and the second conductors 280. In addition, the particles (e.g., diamonds) 291 dispensed in the conductive medium 270 provide an extra mechanical interlock for the conductive medium 270 to the first conductors 140 and/or second conductors 280. The particles 291 can also be coated with a conductive material to increase conductivity.

In another embodiment, instead of using the conductive medium 270, non-conductive adhesive 271, or sharp and small particles 291 to create and/or enhance the electrical and mechanical connection between the first conductors 140 and the second conductors 280, the first conductors 140 and second conductors 280 are directly connected to each other. In one embodiment, soldering is used to directly attach the first conductors 140 to the conductors 280. Conventional soldering technique or laser soldering can be used to solder the first conductors 140 to the second conductors 280.

Conventional solder joining typically uses a low melting point metallic alloy to join two metallic surfaces (e.g., the first conductors 140 and second conductors 280). The solder is heated up to its melting point and placed between the two metallic surfaces to be joined while still in its molten state. It is usually important that both metallic surfaces be specially prepared to promote adhesion with the solder. Thus, both the first conductors 140 and second conductors 280 need to be prepared to promote adhesion with the solder. In the laser soldering technique, a small bit of solder (in paste form, for example) can be placed between the first conductors 140 and the second conductors 280 and a laser is used to heat up the solder to bond the first conductors 140 and the second conductors 280 together. Laser soldering offers the use of a solder as a strap attach method even though plastic substrates (e.g., the substrate 110 and/or 290) are involved in the process. The laser can heat up the solder so fast and with such positional accuracy that the plastic substrates can potentially survive the operation.

In an alternative embodiment, laser welding is used to directly attach the first conductors 140 to the second conductors 280. Typically in laser welding, a high energy IR laser is used to provide a precisely positioned heat source to fuse two compatible metals together. It is envisioned that the high speed, high precision of a laser can be used in the attachment process to melt/fuse the first conductors 140 and the second conductors 280 together to form a strong conductive bond. One way this might be accomplished is to appropriately position the substrate 110 over the substrate 290 and use the laser to heat the attachment area (e.g., the area where the first conductors 140 and second conductors 280 need to contact or connect) to a temperature high enough to fuse the surfaces of the two first conductors 140 and second conductors 280 together. It is conceivable that the heat required might actually burn a hole through the supporting plastic materials. This is acceptable as long as a mechanical/electrical bond is formed for the first conductors 140 and second conductors 280.

When using the soldering or welding method, the first conductors 140 and the second conductors 280 are typically made of conductive materials that are compatible to one another. In some embodiment, holes may be created through the substrate 290 or 110 as the first conductors 140 and second conductors 280 are being soldered or welded together. This is acceptable as these holes are not significantly large so as to affect the function of the assembly.

In another embodiment, crimping is used to cause the first conductors 140 to electrically couple to the second conductors 280. In this embodiment, a crimping tool (e.g., pliers, die and plate) can be used to compress the first conductors 140 to the second conductors 280.

In other embodiments, the first conductors 140 can be coupled to the second conductors 280 directly and without the addition of any conductive medium/adhesive or non-conductive adhesives as previous discussed. These embodiments can use mechanical bonding techniques to create the connection for the first conductors 140 and second conductors 280. A metallic rivet, rod, staple, or wire can be used to punch through the first conductors 140 and the second conductors 280 to establish the mechanical attachment to allow for the electrical interconnection between the first conductors 140 and the second conductors 280. A rivet gun, pressurized air gun, hammer, robotic actuator, stapler, air gun, mechanical impulse device, or other convenient tool is used to accomplish the mechanical attachment.

In one embodiment, the first conductors 140 are placed in temporary contact with the second conductors 280 and then crimped together to create a long-lived electrical connection. The crimping could be accomplished in a variety of ways. For example, the first conductors 140 and second conductors 280 could be compressed between the teeth of a pair of pliers, a crimp die and a flat plate, or a crimp die and a complementary plate. The crimp die could have a variety of component features on it designed to drive a portion of either the first conductors 140 on one component feature, and the second conductors 280 on the other component feature. An impulse below, such as from a hammer, air piston, or mechanical actuator could also be used to facilitate the crimping.

In another embodiment, a pin-shaped die with a corresponding plates on the opposite side is used to mechanically bond the first conductors 140 and 280 together. Pushing the die into the plate causes the conductor in the topmost plate to deform into the conductor on the bottom plate. When this deformation is sufficiently large, a portion of the top conductor will stay partially deformed within the bottom conductor, such that electrical contact is established.

Electrical connection of the first conductors 140 and the second conductors 280 could also be connected together using a wire (not shown) that is sewn into the first conductors 140 and second conductors 280. The wire could be pulled through the conductors or stitched into the conductors with a purely manual system, such as sewing, or a more automated system, such as conductive filament attachment. The sewn connection could be one stitch or a number of stitches, depending on the required strength of the connection.

In one embodiment, the substrate 110 can simply be taped to the substrate 290 that could be a substrate of a large-scale component using conventional taping technique to tightly hold the two substrates together such that the first conductors 140 and the second conductors 280 are in contact with each other to allow for the electrical connection. In one embodiment, the substrate 110 supporting the first conductors 140 is laid over the substrate 240 supporting the second conductors 280. Then an adhesive tape is applied over the substrate 110 and onto the substrate 290, such that the substrate 110 is held against the substrate 290 with the first conductors 140 and second conductors 280 in intimate contact with each other. The adhesive tape could be a pressure sensitive adhesive film, a dry film with a B-staged thermoset adhesive, a UV-curing adhesive, to name a few possibilities. The adhesive tape could be applied to the substrate 110 on the substrate 290, or, alternatively, the substrate 110 could be placed on the adhesive tape to begin with, and then the adhesive tape could be applied to the substrate 290 such that the first conductors 140 on the substrate 110 is appropriately aligned with respect to the second conductors 280 on the substrate 290.

In another embodiment, the first conductors 140 and the second conductors 280 can be electrically connected through various mechanical methods. In one embodiment, thermosonic bonding is used to bond the first conductors 140 and the conductors 280 together. Thermosonic bonding is useful when the first conductors 140 and the second conductors 280 are made of materials that easily fuse together. In one embodiment, either the substrate 110 or the substrate 290 will need to be heated. This can be done by placing the substrate to be heated on a heated stage. If necessary, the substrate (110 or 290) can be heated by heating the pick-up tool. Other methods of heating the substrate may be used, such as heated gas. The substrate 110 is then placed on the substrate 290 such that the first conductors 140 touch the second conductors 280. Pressure is then applied to the assembly to ensure good contact. Ultrasonic energy (vibration) is next applied to the assembly for a predetermine length of time. In one embodiment, to accommodate for any planarity angle between the bonding tool and the part a polymer layer may be introduced between the bonding head of the bonding tool and the substrate 110 or substrate 290. Thermosonic bonding requires less time than some of the other methods. Thermosonic bonding can be used to fuse metals (e.g., Au—Au) and thus can offer lower contact resistance. The addition of ultrasonic energy allows for interface temperature to be lower than otherwise may be required.

In one embodiment, thermocompression bonding is used to bond the first conductors 140 and the second conductors 280 together. Thermocompression bonding is also useful when the first conductors 140 and the second conductors 280 are made of materials that do not easily fuse together. Thermocompression bonding is similar to thermosonic bonding except that instead of having the ultrasonic energy, thermocompression uses pressure to get the physical contact.

In addition, thermosonic bonding and thermocompression bonding can be used to bond the first conductors 140 and the second conductors 280 together when an intermediate medium (e.g., conductive medium 270 or non-conductive adhesive 271) is deposited between the first conductors 140 and the second conductors 280 as previously described.

Figure 3A:
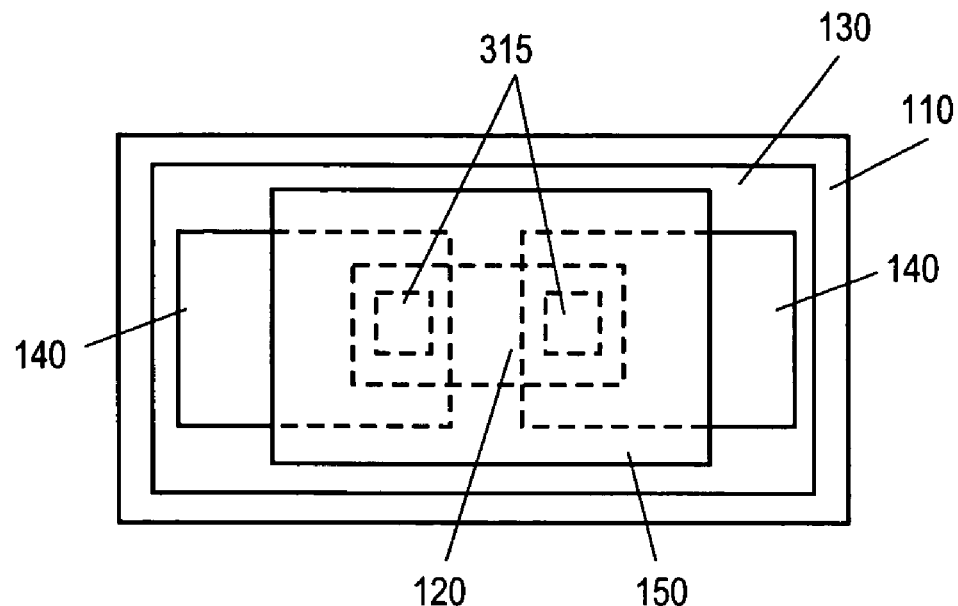
FIG. 3A illustrates a view of an embodiment of the apparatus of FIG. 1 along the line A—A in the direction indicated.

FIG. 3A illustrates a view of an embodiment of the strap of FIG. 1 along the line A—A in the direction indicated. The various overlaps between the substrate 110, the NanoBlock IC 120, the planarization layer 130, the first conductors 140 and the insulating layer 150 are all illustrated. Moreover, contact holes 315 in the planarization layer 130 are illustrated, thus making apparent the connection between the first conductors 140 and the NanoBlock IC 120.

Figure 3B:
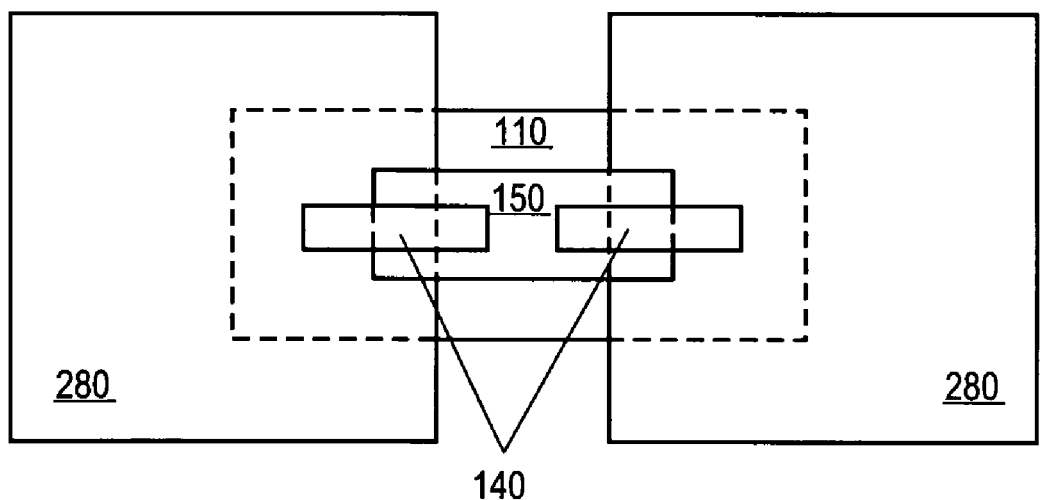
FIG. 3B illustrates a view of an embodiment of the apparatus of FIG. 2 along the line B—B in the direction indicated.

FIG. 3B illustrates a view of an embodiment of the apparatus of FIG. 2 along the line B—B in the direction indicated. Illustrated are overlaps between the first conductors 140, the insulating layer 150, and the second conductors 280. For clarity, the substrate 110 is also shown and the substrate 290 is not shown.

Figure 4:
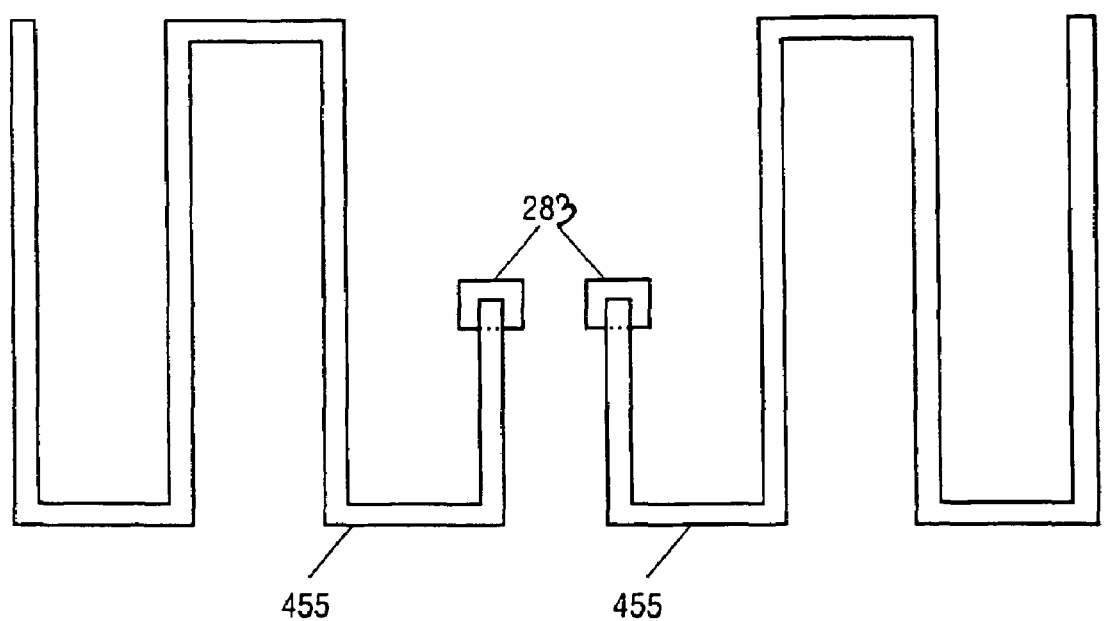
FIG. 4 illustrates an embodiment of an antenna.

FIG. 4 illustrates an embodiment of an antenna. Each arm 455 is connected to antenna conductor pad 283, which is the same as the second conductor 280 in one embodiment. Note that in an alternate embodiment, the arms 455 may simply form the antenna conductor that includes the antenna conductor pads 283, making them a single unitary structure of both arm and pad.

Figure 5:
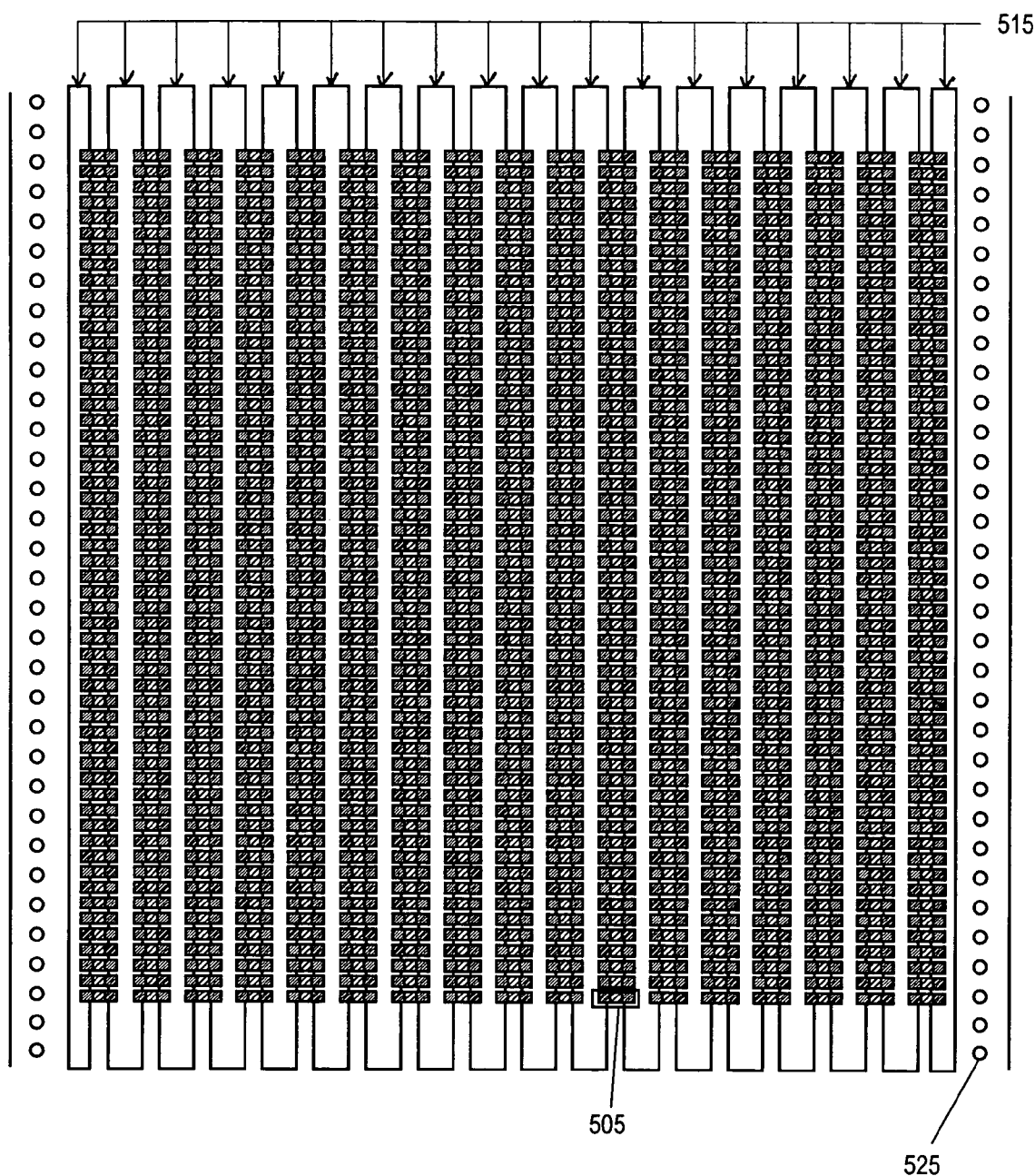
FIG. 5 illustrates an embodiment of a web section having adhered thereon straps including functional blocks such as NanoBlock ®ICs (NanoBlock is a trademark and/or trade name of ALIEN technology Corporation).

FIG. 5 illustrates an embodiment of a web section having adhered thereon straps including NanoBlock ICs. Each strap 505 (of which one exemplary strap 505 is labeled) is adhered to a pair of electrically conductive tape strips 515. The tape strips 515 form part of a larger spool, which also includes through-holes 525 for purposes of spooling. In one embodiment, the tape strips 515 may be anisotropically conductive film (ACF), with the conductors (e.g., the first conductors 140) of the straps 505 adhered to the ACF. Moreover, the tape spools may be formed with gaps between columns of straps 515 allowing for slitting the tape through the gap to produce a single column of straps.

Figure 6:
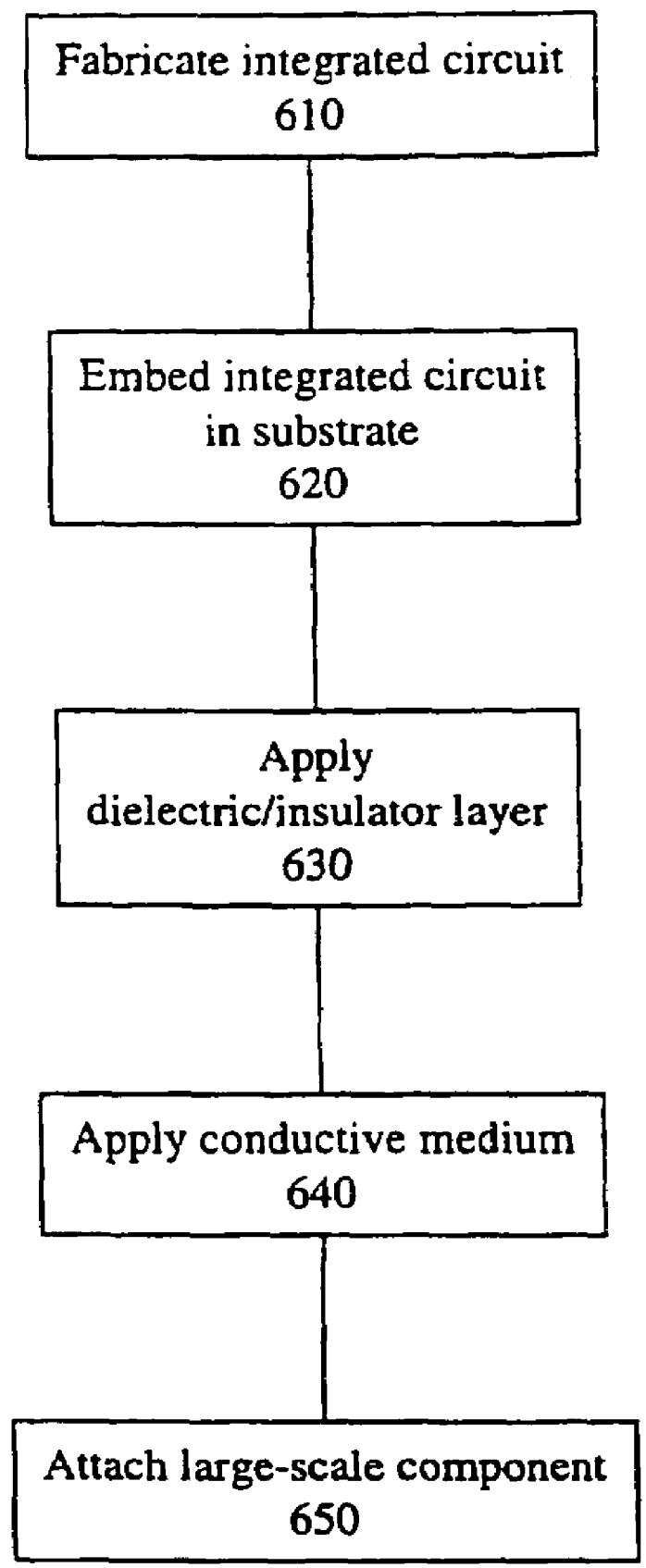
FIG. 6 illustrates an embodiment of a method of forming an apparatus including both small-feature-size and large-feature-size components.

FIG. 6 illustrates an embodiment of a method of forming an apparatus including both small-feature-size and large-feature-size components. At block 610, the integrated circuits are fabricated, such as through a conventional VLSI method. At block 620, the integrated circuits are embedded into substrate(s). At block 630, processing for purposes of forming planarization and insulation layers occurs, and an insulator is formed (one skilled in the art will appreciate that a thin-film or a thick-film insulation layer may also be formed). At block 640, a conductive medium is applied to the substrate, such as by screen printing on paste or through other additive processes. At block 650, a large-scale component is attached to the conductive medium. Note that in one embodiment, the tape spool of FIG. 5 may be used to attach a large volume of straps to large-scale components by attaching each strap individually and then cutting the tape after attachment. In an alternate embodiment, the conductive medium 640 is applied directly to the substrate that contains ICs 620, omitting the insulating layer.

Figure 7:
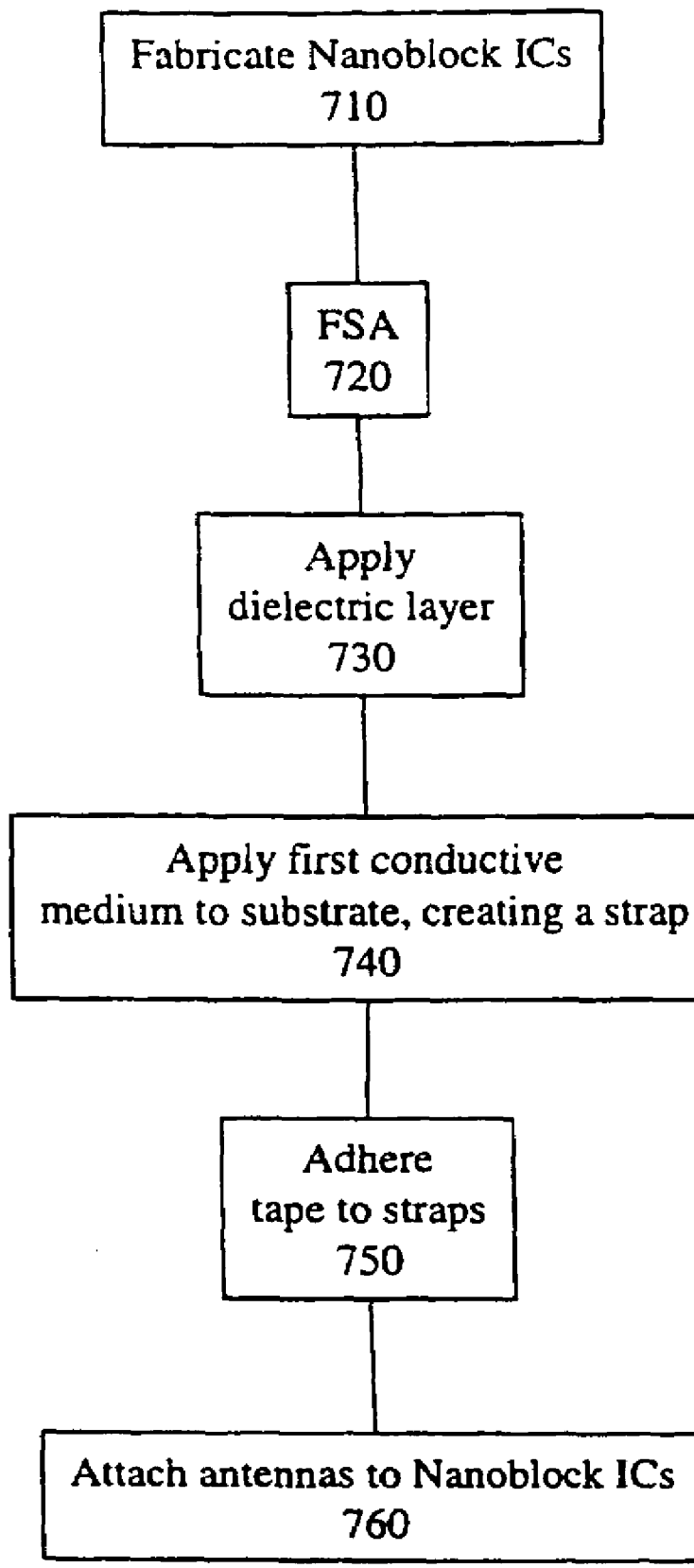
FIG. 7 illustrates an alternate embodiment of a method of forming an apparatus including both small-feature-size and large-feature-size components.

FIG. 7 illustrates an alternative embodiment of a method of forming an apparatus including both small-feature-size and large-feature-size components, with particular reference to fabrication of RF-ID tags using functional blocks such as NanoBlock ICs. At block 710, NanoBlock ICs are fabricated, such as through conventional VLSI methods. It is to be appreciated that the NanoBlock IC can be deposited, attached, or otherwise contained in the substrate by other suitable methods. At block 720, NanoBlock ICs are embedded in substrates through FSA. At block 730, any necessary post-FSA processing for purposes of forming planarization layers, and/or insulation layers, occurs. In particular, at least one thin-film dielectric is formed. As will be appreciated by one skilled in the art, the thin-film dielectric may not be necessary in alternative embodiments. At block 740, a first conductive medium is applied to the substrates, such as in the form of a paste screened on to the substrates for example, thus creating straps. At block 750, an electrically conductive tape is adhered to the conductive medium on the straps. At block 760, antennas are attached to the straps, such that the antennas are electrically coupled to the NanoBlock ICs of the corresponding straps.

Figure 8:
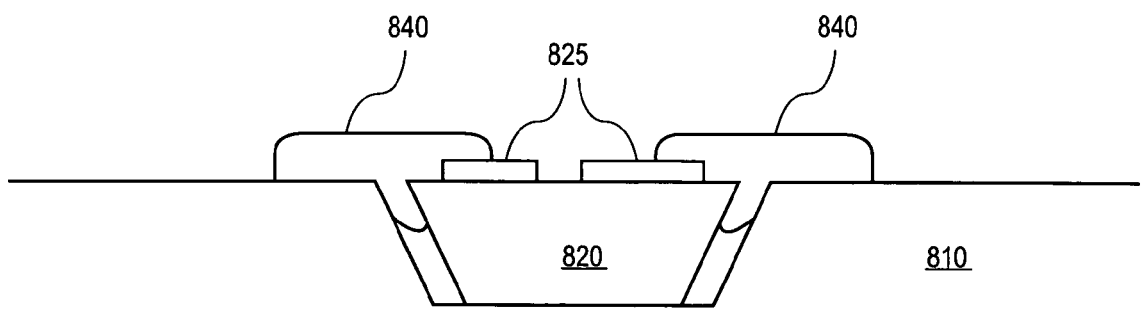
FIG. 8 illustrates an alternate embodiment of a strap from a side view.

FIG. 8 illustrates an alternate embodiment of a strap from a side view. As will be appreciated, the embodiment of FIG. 8 is similar to the embodiment of FIG. 1. However, FIG. 8 illustrates a substrate 810, having embedded or contained therein (in an opening) an integrated circuit 820, with pads 825. Each of the pads 825 has deposited thereon through use of an additive process a first conductor 840, such as a silver ink for example. Usually, but not always, the first conductor 840 is deposited such that it contacts one and only one pad 825 directly, thus allowing for separate conductors for each electrical contact of a circuit.

Moreover, it will be appreciated that the size of the pads 825 may be greater than the size of similar pads on an integrated circuit such as the NanoBlock IC 120 of FIG. 1, in that the pads 825 must interface directly with material (the first conductor 840) having a much larger feature size than is common for VLSI devices. Note that in one embodiment, the first conductor 840 may be expected to have an as-deposited thickness of approximately 10–15 $\mu$ms and a final thickness on the order of 1 $\mu$m or less, and that pads 825 may have minimum dimensions on the order of 20×20 $\mu$ms or more.

Figure 9:
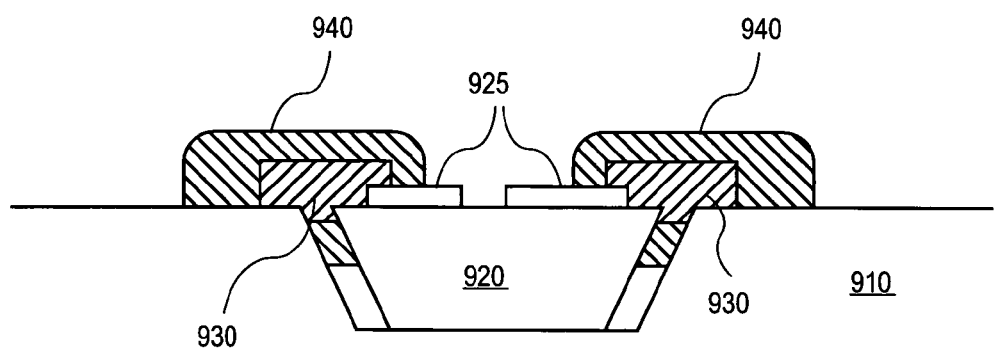
FIG. 9 illustrates yet another alternate embodiment of a strap from a side view.

FIG. 9 illustrates yet another alternate embodiment of a strap from a side view. FIG. 9 illustrates a similar embodiment to that of FIG. 8, which further incorporates an insulator. A substrate 910 including an integrated circuit 920 embedded or contained therein is provided. Pads 925 are a part of the integrated circuit 920, and may be expected to have similar dimensions to the pads 825. An insulating layer (dielectric) 930 is deposited on the integrated circuit 920 through use of a thick film process. The insulating layer 930 may be expected to have a thickness on the order of 10 microns. Also deposited with an additive process is a first conductor 940, which covers both the insulating layer 930 and some portion of a pad 925, thus, allowing for electrical contact between the integrated circuit 920 and a large-scale component (e.g., through a second conductor included with the large-scale component). The first conductor 940 may be expected to have similar characteristics to the first conductor 840.

FIG. 10 illustrates a side view of still another alternate embodiment of a strap. In this embodiment, a substrate 1010 including an integrated circuit 1020 incorporated or contained therein is provided. On top of the substrate 1010, an insulator 1030 is formed. The insulator 1030 is a patterned with vias through which the first conductors 1040 may achieve contact with the conductive pads 1025 of the integrated circuit 1020. As will be appreciated, the vias require greater precision in patterning than do any of the insulators of conductor components of FIGS. 8 and 9. Moreover, as will be appreciated, the substrate 1010 may have the insulator 1030 covering nearly its whole surface, rather than the limited areas of FIG. 9. Additionally, it will be appreciated that the pads 1025 may be smaller on the integrated circuit 1020 than similar pads of the integrated circuits 920 and 820.

Figure 11:
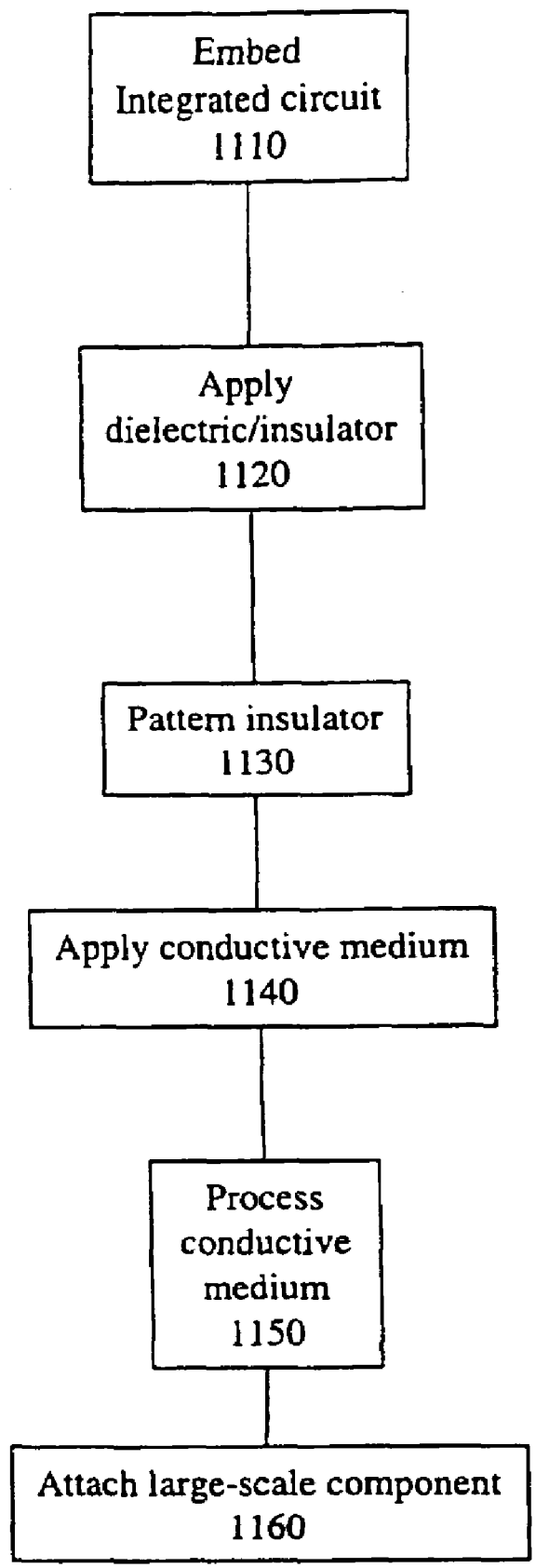
FIG. 11 illustrates another alternate embodiment of a method of forming an apparatus including both small-feature-size and large-feature-size components.

FIG. 11 illustrates another alternate embodiment of a method of forming an apparatus including both small-feature-size and large-feature-size components. At block 1110, an integrated circuit is embedded within a supporting substrate. At block 1120, an insulator is applied to the substrate. At block 1130, the insulator is patterned such as through a photolithographic thin-film process, whereby portions of the insulator are removed to expose portions of the substrate or integrated circuit, such as bond or conductive pads. Further cleaning, such as washing away photoresist for example, may be involved as part of application, patterning, or even in a post-etch phase. Alternatively, as will be appreciated, a photosensitive insulator or dielectric may be used, thereby eliminating the need for photoresist for example.

At block 1140, a conductive material is applied to the substrate, coating all or part of the insulator to form first conductors. At block 1150, the conductive material is processed (such as by heat curing, for example) as necessary to form a proper conductor (e.g., the first conductors). Note that curing of silver ink is known in the art to be possible at 90–100° C. for some formulations with a reasonable cure time for various manufacturing processes. It will be appreciated that cure times do vary, and that those skilled in the art may adapt cure processes to the needs of a surrounding manufacturing process and the devices to be produced. At block 1160, the large-scale component is attached to the first conductor, thereby achieving electrical coupling with the integrated circuit. In one embodiment, the large-scale component includes second conductors wherein the first conductors and the second conductors (either directly or through a conductive medium as previously discussed) electrically interconnect the IC to the large-scale component. Also note that the final processing of the first conductor of block 1160 may be performed after the large-scale component is attached at block 1170.

Figure 12B:
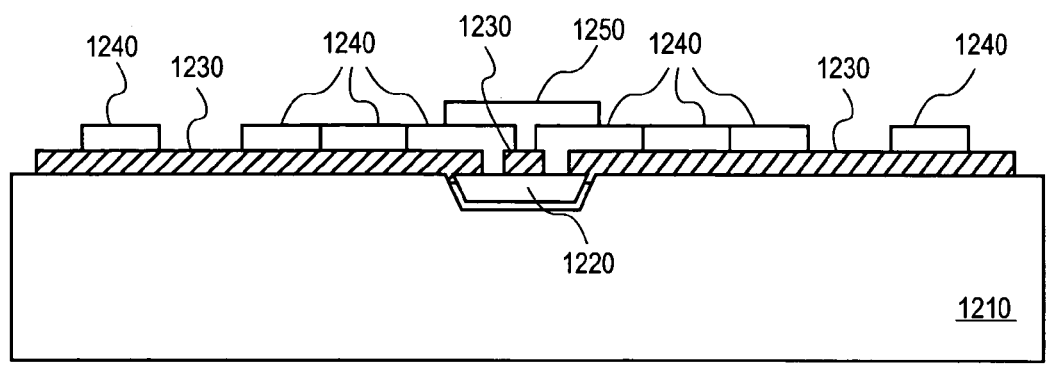
FIG. 12B illustrates a side view of another embodiment of a substrate.
Figure 12A:
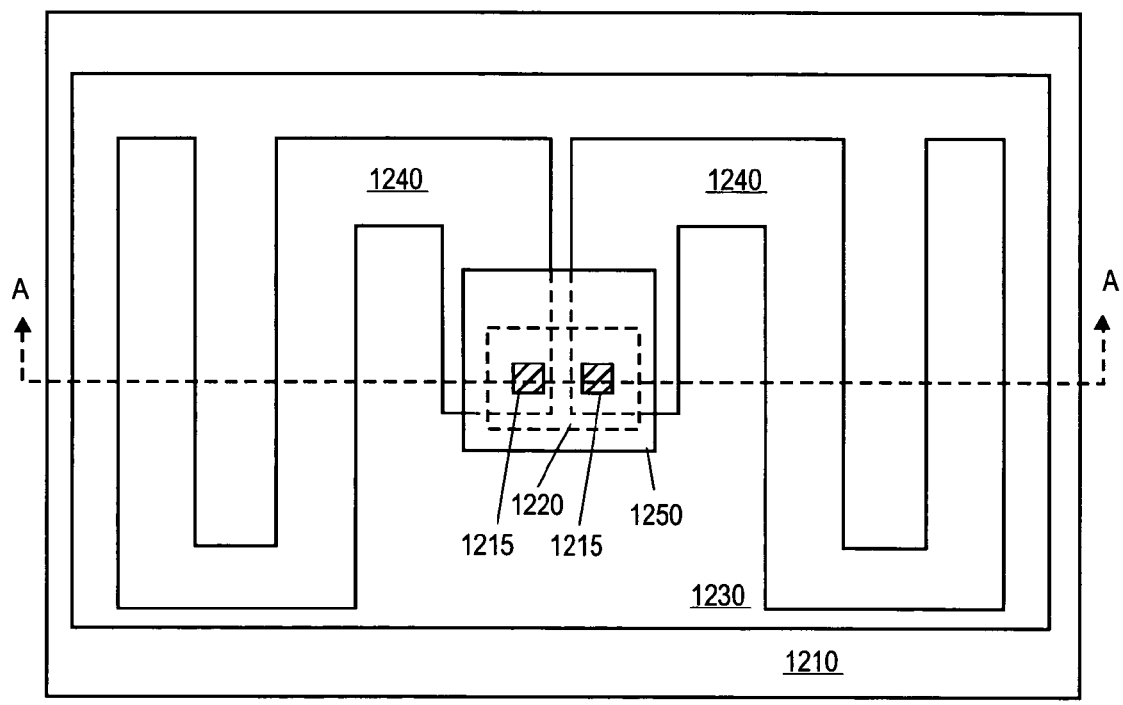
FIG. 12A illustrates a top view of another embodiment of a substrate.

For the most part, the previous description has concentrated on use of the invention in conjunction with attaching a strap having embedded, contained, or incorporated therein an integrated circuit to a separate large-scale component. It will be appreciated that other embodiments exist in which the separate large-scale component is not involved. In particular, a large-feature-size component may be incorporated as part of the strap, such as an embedded conductor acting as an antenna, or may be formed on the strap as illustrated in FIGS. 12A and 12B. Printing or otherwise using additive processing technology to form an antenna 1240 of the conductive medium on the strap is one option.

Alternately, other large-feature-size components, such as power sources, sensors, or logic devices for example may either be formed on the strap or attached to the strap. Interconnecting a NanoBlock IC or other small or micro functional blocks with such large-feature-size components on the strap may be accomplished through use of a conductors 1440, allowing for electrical coupling between a large-feature-size components 1460 and a small-feature-size (NanoBlock IC for example) components 1420, as in FIG. 14. Moreover, a conductive medium 1340 may be used to interconnect two or more small-feature-size components embedded in a single substrate, such as two NanoBlock ICs for example, as illustrated in FIG. 13.

FIG. 12A illustrates a top view of another embodiment of a substrate. A substrate 1210 may be a substrate such as those discussed previously, including a flexible or rigid material. An IC 1220 is embedded in an opening in the substrate 1210. An insulator 1230 is a layer of insulating material (or a dielectric layer) formed on top of both the substrate 1210 and the IC 1220 and may have planarizing properties. Contact holes 1215 are holes in the insulator 1230 above contact pads of the IC 1220, allowing for physical contact and electrical connection between the IC 1220 and a first conductor 1240. An insulating layer 1250 is another insulator or dielectric above portions of the first conductor 1240, the insulator 1220 and the substrate 1210, and above all of the IC 1220. Note that the actual configuration of the various layers may vary considerably. For example, first conductor 1240 is formed into two arms of an antenna, such as may be useful for radio frequency applications. However, batteries, sensors, power supplies, button cells, and displays and display electrodes may also be formed through use of conductors and/or conductive media and other materials.

FIG. 12B illustrates a side view of another embodiment of a substrate. As is illustrated, the first conductor 1240 occupies contact holes 1215 of FIG. 12A to contact directly with the IC 1220. Furthermore, as will be appreciated, the segments illustrated with respect to the first conductor 1240 correspond to the various segments of the antenna as it traces its path along the surface of the insulator 1230. Along these lines, it will be appreciated that the presence of the insulator 1230 may not be necessary in some instances.

Figure 13:
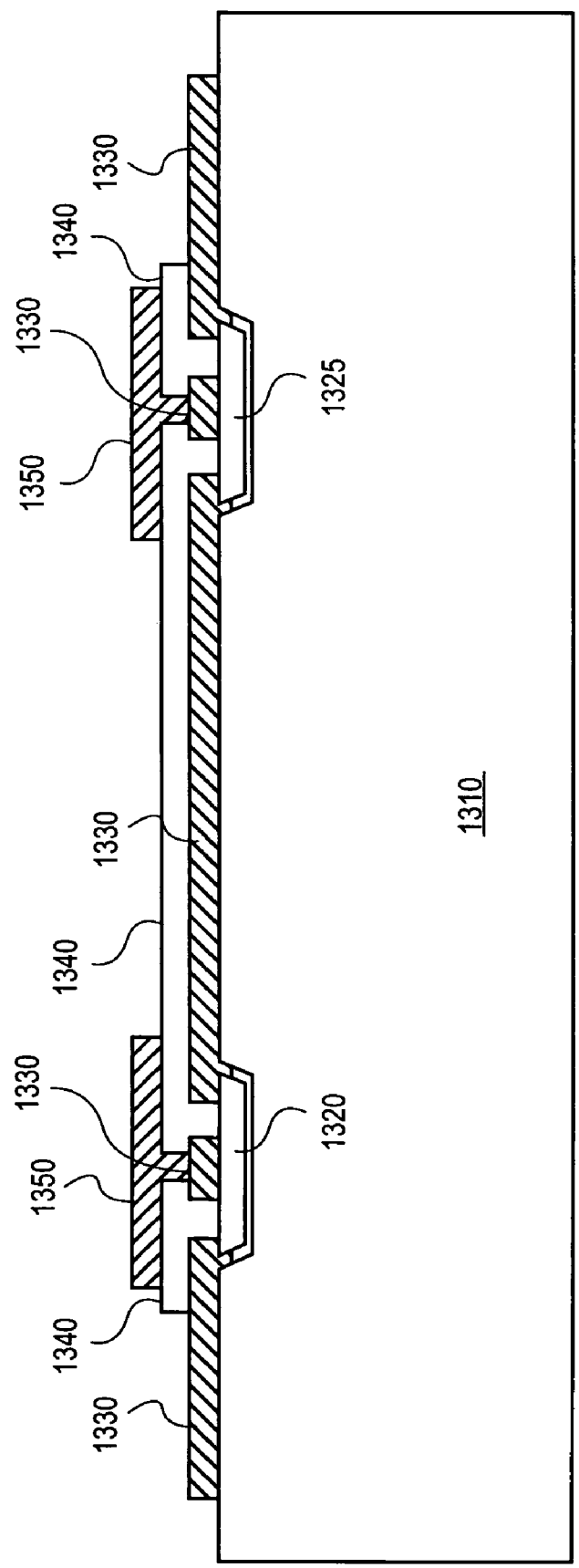
FIG. 13 illustrates a side view of yet another embodiment of a substrate.

FIG. 13 illustrates a side view of yet another embodiment of a substrate. A substrate 1310 includes a first IC 1320 and a second IC 1325. An insulator 1330 is formed above the IC 1320, the IC 1325 and the substrate 1310. A first conductor 1340 is formed the above insulator 1330, and contacts both the IC 1320 and the IC 1325. One portion of the first conductor 1340 forms an electrical connection between the IC 1320 and the IC 1325, thereby electrically coupling the IC 1320 to the IC 1325. Above both of the IC 1320 and IC 1325 are formed insulator layers 1350.

Figure 14:
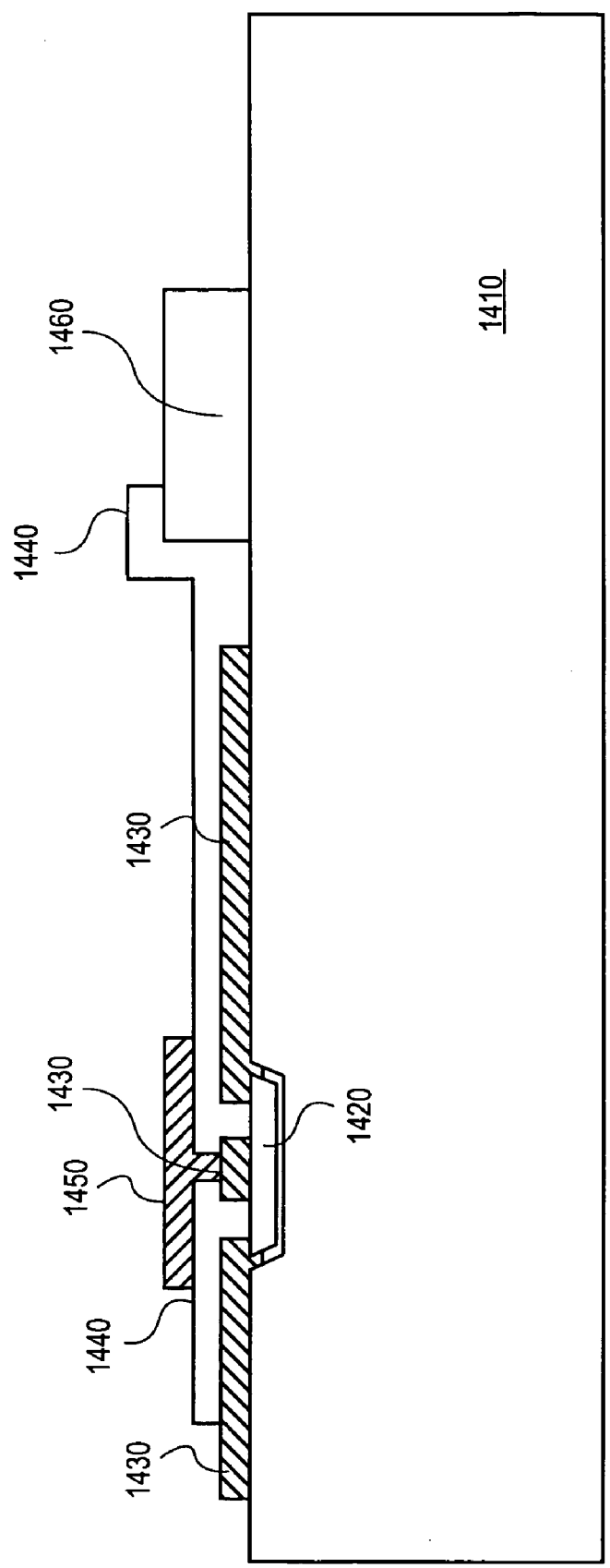
FIG. 14 illustrates a side view of still another embodiment of a substrate.

FIG. 14 illustrates a side view of still another embodiment of a substrate. A substrate 1410 has embedded or contained in an opening therein an IC 1420. Formed above the substrate 1410 and the IC 1420 is an insulator 1430. Formed above the insulator 1430 and, connected to the IC 1420 is a conductor 1440, a portion of which is connected to a sensor 1460, thereby electrically coupling the IC 1420 to the sensor 1460. Formed above a portion of the conductor 1440 and the insulator 1430 is an insulator 1450, which may or may not be of the same material as the insulator 1430.

In the foregoing detailed description, the method and apparatus of the present invention has been described with reference to specific exemplary embodiments thereof. It will, however, be evident that various modifications and changes may be made thereto without departing from the scope of the embodiments of the present invention. In particular, the separate blocks of the various block diagrams represent functional blocks of methods or apparatuses and are not necessarily indicative of physical or logical separations or of an order of operation inherent in the scope of the embodiments of the present invention. For example, the various blocks of FIG. 1 may be integrated into components, or may be subdivided into components, and may alternately be formed in different physical shapes from those illustrated. Similarly, the blocks of FIG. 6 (for example) represent portions of a method that, in some embodiments, may be reordered or may be organized in parallel rather than in a linear or step-wise fashion. The present specification and figures are accordingly to be regarded as illustrative rather than restrictive.

What is claimed is:

1. A method comprising:
    attaching a first conductor formed on top of a first substrate containing a functional block to a second conductor of a large-scale component, the functional block being embedded in a first substrate and being electrically connected to the first conductor, and the large-scale component being formed on a second substrate;
    the first conductor being interconnected to the second conductor by an anisotropic conductive medium using one of thermosonic bonding and thermocompression bonding;
    each of the first conductor and the second conductor being independently made out of any one of a metal, a thermoplastic material, and a thermosetting material.

2. The method of claim 1 wherein any one of or both of the thermoplastic material and the thermosetting material is inherently conductive.

3. The method of claim 1 further comprises dispensing a plurality of small and sharp particles into the material used to make one of the first conductor and the second conductor to create a mechanical interlock to enhance the attachment between the first conductor and the second conductor.

4. The method of claim 1 further comprises dispensing the functional block into the first substrate using fluidic self assembly.

5. A method comprising:
    attaching a first conductor being made of a thermoplastic or a thermosetting material to an integrated circuit embedded in a first substrate, the first conductor electrically connected to the integrated circuit, the first conductor being formed on a top surface of the first substrate, wherein an anisotropic conductive medium is attached to the first conductor; and
    attaching a large-scale component to the first conductor, the large-scale component electrically connected to the first conductor, and the large-scale component formed on a second substrate.

6. The method of claim 5 further comprising:
    embedding the integrated circuit in the first substrate.

7. The method of claim 5 further comprising:
    embedding the integrated circuit in the first substrate using fluidic self assembly.

8. The method of claim 5, wherein attaching the first conductor to the integrated circuit is accomplished by any one of screen printing, flatbed and rotary screen printing, stencil printing, ink jet printing, gravure printing, flexographic printing, pad stamping, electrostatic printing, dispensing through a needle and pipette, laminating, hot pressing, laser assisted chemical vapor deposition, physical vapor deposition, shadow masking, evaporating, extrusion coating, curtain coating, and electroplating.

9. The method of claim 5 further comprises attaching the anisotropic conductive medium to a second conductor included with the large-scale component to interconnect the integrated circuit to the large-scale component.

10. The method of claim 9 further comprises using one of thermosonic bonding and thermocompression bonding to facilitate the attaching of the conductive medium to any one of the first conductor and the second conductor.

11. A method comprising:
    embedding an integrated circuit into a first substrate and disposing a first conductor on a top surface of the first substrate, the integrated circuit electrically connected to the first conductor, the first conductor being made of a thermosetting material or a thermoplastic material; and
    electrically coupling a large-scale component having a second conductor to the integrated circuit, the second conductor being electrically coupled to the first conductor via an anisotropic conductive medium to electrically couple the large-scale component to the integrated circuit, the large-scale component including a second substrate.

12. The method of claim 11 wherein any one or both of the thermoplastic material and the thermosetting material is inherently conductive.

13. The method of claim 11 further comprises coupling the second conductor directly to the first conductor wherein an active surface of the integrated circuit faces the second conductor.

14. The method of claim 11 wherein an active surface of the integrated circuit faces the second conductor.

15. The method of claim 11 wherein the thermoplastic material has conductive fillers.

16. The method of claim 11 wherein the thermosetting material has conductive fillers.

17. The method of claim 11, wherein the conductive medium is any one of a polymer carrier having conductive particles, an inherently conductive thermoplastic material, a thermoplastic material having conductive particles, an inherently conductive thermosetting material, a thermosetting material having conductive particles, a conductive polymer, a carbon-based conductor, a carrier having conductive fibers, a carrier having conductive carbon nanotubes, a pressure sensitive adhesive having conductive fillers, and a solder.

18. The method of claim 11, wherein the integrated circuit is a circuit suitable for use with radio frequency, display, sensor, or phase array antenna applications.

19. The method of claim 11, wherein the large-scale component includes an antenna, an electronic display, a display electrode, a sensor, a power source, a memory device, and a logic device formed on that second substrate.

20. The method of claim 19, wherein the antenna is part of the second conductor.

21. The method of claim 11 further comprises dispensing a plurality of small and sharp particles in one of the first conductor or the second conductor, the particles to create a mechanical interlock between the first conductor and the second conductor when the first conductor and the second conductor are placed in immediate contact with one another.

22. The method of claim 21, wherein at least one of the first conductor and the second conductor is made of a thermosetting or a thermoplastic material.

23. The method of claim 21, wherein the particles are coated with a conductive material.

24. The method of claim 21, forming an edge-seal around the edges of the first conductor and the second conductor.

25. The method of claim 11 further comprises dispensing a plurality of small and sharp particles in one of the first conductor and the second conductor to enhance contact to the first conductor or the second conductor.

26. The method of claim 11 further comprises forming a conductive medium on the first conductor to interconnect the first conductor to the second conductor and dispensing a plurality of small and sharp particles in the conductive medium.

27. The method of claim 11 further comprises disposing a plurality of small and sharp particles into the material used to make one of the first conductor and the second conductor to attach the first conductor to the second conductor.

* * * * *